(12) United States Patent
Terasaki et al.

(10) Patent No.: US 11,062,974 B2
(45) Date of Patent: Jul. 13, 2021

(54) BONDED BODY, POWER MODULE SUBSTRATE, METHOD FOR MANUFACTURING BONDED BODY, AND METHOD FOR MANUFACTURING POWER MODULE SUBSTRATE

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/070,332

(22) PCT Filed: Jan. 20, 2017

(86) PCT No.: PCT/JP2017/001840
§ 371 (c)(1),
(2) Date: Jul. 16, 2018

(87) PCT Pub. No.: WO2017/126641
PCT Pub. Date: Jul. 27, 2017

(65) Prior Publication Data
US 2019/0035710 A1 Jan. 31, 2019

(30) Foreign Application Priority Data

Jan. 22, 2016 (JP) .............................. JP2016-010675
Jan. 5, 2017 (JP) .................................. 2017-000381

(51) Int. Cl.
*H01L 23/48* (2006.01)
*H01L 23/373* (2006.01)
(Continued)

(52) U.S. Cl.
CPC ........ *H01L 23/3735* (2013.01); *C04B 35/645* (2013.01); *C04B 37/026* (2013.01);
(Continued)

(58) Field of Classification Search
CPC . H01L 23/3735; C04B 35/645; C04B 37/026; C04B 2235/6562
See application file for complete search history.

(56) References Cited

U.S. PATENT DOCUMENTS 5,741,598 A * 4/1998 Shiotani ............... H05K 1/0346
428/458
6,964,819 B1 * 11/2005 Girt .......................... G11B 5/66
428/828

(Continued)

FOREIGN PATENT DOCUMENTS

JP     4375730 B2    12/2009
JP     2014-183118 A  9/2014
(Continued)

OTHER PUBLICATIONS

International Search Report dated Apr. 4, 2017, issued for PCT/JP2017/001840 and English translation thereof.

*Primary Examiner* — Hoa B Trinh
(74) *Attorney, Agent, or Firm* — Locke Lord LLP; James E. Armstrong, IV; Nicholas J. DiCeglie, Jr.

(57) ABSTRACT

A bonded body of the present invention includes a ceramic member formed of ceramics and a Cu member formed of Cu or a Cu alloy. In a bonded interface between the ceramic member and the Cu member, a Cu—Sn layer which is positioned on the ceramic member side and in which Sn forms a solid solution in Cu, a first intermetallic compound layer which is positioned on the Cu member side and contains Cu and Ti, and a second intermetallic compound layer which is positioned between the first intermetallic
(Continued)

compound layer and the Cu—Sn layer and contains P and Ti are formed.

7 Claims, 9 Drawing Sheets

(51) Int. Cl.
*C04B 35/645* (2006.01)
*C04B 37/02* (2006.01)
*H01L 21/48* (2006.01)
*F28F 3/12* (2006.01)
*F28F 21/08* (2006.01)

(52) U.S. Cl.
CPC .. *H01L 21/4882* (2013.01); *C04B 2235/6562* (2013.01); *C04B 2235/6567* (2013.01); *C04B 2235/6581* (2013.01); *C04B 2235/661* (2013.01); *C04B 2237/122* (2013.01); *C04B 2237/124* (2013.01); *C04B 2237/126* (2013.01); *C04B 2237/343* (2013.01); *C04B 2237/366* (2013.01); *C04B 2237/368* (2013.01); *C04B 2237/407* (2013.01); *C04B 2237/704* (2013.01); *C04B 2237/706* (2013.01); *C04B 2237/708* (2013.01); *C04B 2237/72* (2013.01); *F28F 3/12* (2013.01); *F28F 21/085* (2013.01); *H01L 2224/32225* (2013.01)

(56) References Cited

U.S. PATENT DOCUMENTS

| | | | |
|---|---|---|---|
| 8,564,118 B2 * | 10/2013 | Kuromitsu | H01L 23/3735 257/700 |
| 10,173,282 B2 * | 1/2019 | Terasaki | B23K 35/286 |
| 2004/0262367 A1 * | 12/2004 | Nakamura | H01L 23/3735 228/122.1 |
| 2010/0200120 A1 * | 8/2010 | Horie | C23C 18/165 148/237 |
| 2016/0013073 A1 | 1/2016 | Terasaki et al. | |
| 2016/0152004 A1 * | 6/2016 | Niino | B32B 15/20 428/663 |
| 2016/0167170 A1 * | 6/2016 | Terasaki | B23K 35/286 219/121.61 |
| 2016/0276244 A1 | 9/2016 | Terasaki et al. | |

FOREIGN PATENT DOCUMENTS

| | | |
|---|---|---|
| JP | 2015-043392 A | 3/2015 |
| JP | 2015-062953 A | 4/2015 |
| JP | 2015-065423 A | 4/2015 |

* cited by examiner

BONDED BODY, POWER MODULE SUBSTRATE, METHOD FOR MANUFACTURING BONDED BODY, AND METHOD FOR MANUFACTURING POWER MODULE SUBSTRATE

TECHNICAL FIELD

The present invention relates to a bonded body in which a ceramic member and a Cu member are bonded to each other and to a power module substrate in which a Cu foil formed of Cu or a Cu alloy is bonded to a ceramic substrate.

Priorities are claimed on Japanese Patent Application No. 2016-010675 filed on Jan. 22, 2016 and Japanese Patent Application No. 2017-000381 filed on Jan. 5, 2017, the contents of which are incorporated herein.

BACKGROUND ART

A semiconductor device such as LED or a power module has a structure in which a semiconductor element is bonded to the top of a circuit layer formed of a conductive material.

A power semiconductor element for high power control that is used for controlling wind power generation, an electric vehicle such as an electromobile, and the like generates a large amount of heat. Accordingly, as a substrate on which such an element is mounted, a power module substrate obtained by bonding a metal sheet as a circuit layer having excellent conductivity to one surface of a ceramic substrate formed of, for example, aluminum nitride (AlN) has been widely used in the related art. Furthermore, sometimes a metal sheet is bonded as a metal layer to the other surface of the ceramic substrate.

For example, a power module substrate described in PTL 1 has a structure in which a circuit layer is formed by bonding a Cu foil (Cu member) to one surface of a ceramic substrate (ceramic member). In the power module substrate, the Cu foil is disposed on one surface of the ceramic substrate through a Cu—Mg—Ti brazing material interposed therebetween, and a heat treatment is performed to bond the Cu foil.

Incidentally, in a case where the ceramic substrate and the Cu foil are bonded to each other through the Cu—Mg—Ti brazing material as disclosed in PTL 1, an intermetallic compound containing Cu, Mg, or Ti is formed in the vicinity of the ceramic substrate.

The intermetallic compound formed in the vicinity of the ceramic substrate is hard. Therefore, in a case where a thermal cycle is loaded on the power module substrate, a high thermal stress is caused in the ceramic substrate. Accordingly, unfortunately, the ceramic substrate easily cracks.

In addition, in a case where the hard intermetallic compound is formed in the vicinity of the ceramic substrate at the time of bonding the ceramic substrate and the circuit layer to each other, a bonding rate between the ceramic substrate and the circuit layer may be reduced, and the ceramic substrate and the circuit layer may not be able to be excellently bonded to each other.

Therefore, for example, PTLs 2 and 3 suggest a power module substrate in which a ceramic substrate and a circuit layer are bonded to each other by using a Cu—P—Sn-based brazing material and a Ti material.

In the inventions described in PTLs 2 and 3, a Cu—Sn layer is formed on the ceramic substrate side, and a hard intermetallic compound layer is not provided in the vicinity of the ceramic substrate. Therefore, the thermal stress caused in the ceramic substrate in a case where a thermal cycle is loaded can be reduced, and the occurrence of cracking in the ceramic substrate can be inhibited.

CITATION LIST

Patent Literature

[PTL 1] Japanese Patent No. 4375730
[PTL 2] Japanese Unexamined Patent Application, First Publication No. 2015-043392
[PTL 3] Japanese Unexamined Patent Application, First Publication No. 2015-065423

SUMMARY OF INVENTION

Technical Problem

By the way, in recent years, the heat-generating temperature of the semiconductor element mounted on the power module substrate has tended to be increased. Therefore, it has been required for the heat in the power module substrate to be more efficiently radiated than in the related art.

In the power module substrate described in PTL 2, a Ti layer is formed between the ceramic substrate and the circuit layer formed of Cu or a Cu alloy, and the formed Ti layer has a thickness equal to or greater than 1 µm and equal to or smaller than 15 µm which is a relatively large thickness. Therefore, a high thermal resistance may be caused in a lamination direction, and the heat may not be able to be efficiently radiated.

In addition, in the power module substrate described in PTL 3, a Cu—Sn layer and an intermetallic compound layer containing P and Ti are formed between a ceramic substrate and a circuit layer formed of Cu or a Cu alloy. In a case where the substrate is used in a high-temperature environment, cracks start to occur from the intermetallic compound layer containing P and Ti, and hence the bonding may become insufficient.

The present invention has been made in consideration of the circumstances described above, and an object thereof is to provide a bonded body in which a ceramic member and a Cu member are excellently bonded to each other and which exhibits a low thermal resistance in a lamination direction and enables heat to be efficiently radiated, a power module substrate, a method for manufacturing the bonded body, and a method for manufacturing a power module substrate.

Solution to Problem

In order to achieve the aforementioned object, according to an aspect of the present invention, there is provided a bonded body including a ceramic member formed of ceramics and a Cu member formed of Cu or a Cu alloy, in which in a bonded interface between the ceramic member and the Cu member, a Cu—Sn layer which is positioned on the ceramic member side and in which Sn forms a solid solution in Cu, a first intermetallic compound layer which is positioned on the Cu member side and contains Cu and Ti, and a second intermetallic compound layer which is positioned between the first intermetallic compound layer and the Cu—Sn layer and contains P and Ti are formed.

According to the bonded body as the aspect of the present invention, the first intermetallic compound layer which is positioned on the Cu member side and contains Cu and Ti is formed. Therefore, the Cu member and the second intermetallic compound layer can be reliably bonded to each other, and even though the bonded body is used in a high-temperature environment, a brazing bonding strength between the Cu member and the ceramic member can be secured. Furthermore, because a Ti layer is not formed or is extremely thin, a thermal resistance in a lamination direction can be kept low, and the heat can be efficiently radiated.

In the bonded body as the aspect of the present invention, a Ti layer may be formed between the first intermetallic compound layer and the second intermetallic compound layer, and a thickness of the Ti layer may be equal to or smaller than 0.5 μm.

In this case, although the Ti layer is formed between the first intermetallic compound layer and the second intermetallic compound layer, the thickness of the Ti layer is equal to or smaller than 0.5 μm. Accordingly, the thermal resistance in the lamination direction can be kept low, and the heat can be efficiently radiated.

Furthermore, in the bonded body as the aspect of the present invention, a thickness of the first intermetallic compound layer is preferably within a range equal to or greater than 0.2 μm and equal to or smaller than 6 μm.

In this case, because the thickness of the first intermetallic compound layer containing Cu and Ti is equal to or greater than 0.2 μm, it is possible to reliably improve the brazing bonding strength between the Cu member and the ceramic member. Meanwhile, because the thickness of the first intermetallic compound layer is equal to or smaller than 6 μm, it is possible to inhibit the occurrence of breaking in the first intermetallic compound layer.

In the bonded body as the aspect of the present invention, a thickness of the second intermetallic compound layer is preferably within a range equal to or greater than 0.5 μm and equal to or smaller than 4 μm.

In this case, because the thickness of the second intermetallic compound layer containing P and Ti is equal to or greater than 0.5 μm, it is possible to reliably improve the brazing bonding strength between the Cu member and the ceramic member. Meanwhile, because the thickness of the second intermetallic compound layer is equal to or smaller than 4 μm, it is possible to inhibit the occurrence of breaking in the second intermetallic compound layer.

According to another aspect of the present invention, there is provided a power module substrate which is the aforementioned bonded body, the power module substrate including a ceramic substrate formed of the ceramic member, and a circuit layer which is formed on one surface of the ceramic substrate and formed of the Cu member, in which in a bonded interface between the ceramic substrate and the circuit layer, a Cu—Sn layer which is positioned on the ceramic substrate side and in which Sn forms a solid solution in Cu, a first intermetallic compound layer which is positioned on the circuit layer side and contains Cu and Ti, and a second intermetallic compound layer which is positioned between the first intermetallic compound layer and the Cu—Sn layer and contains P and Ti are formed.

According to the power module substrate as the aspect of the present invention, the first intermetallic compound layer containing Cu and Ti is formed on the circuit layer side. Therefore, the circuit layer and the second intermetallic compound layer can be reliably bonded to each other, and even though the power module substrate is used in a high-temperature environment, a brazing bonding strength between the circuit layer and the ceramic substrate can be secured. Furthermore, because a Ti layer is not formed or a thin Ti layer having a thickness equal to or smaller than 0.5 μm is formed, a thermal resistance in a lamination direction can be kept low, and the heat from a semiconductor element mounted on the circuit layer can be efficiently radiated.

In the power module substrate as the aspect of the present invention, a metal layer formed of Al or an Al alloy may be formed on the other surface of the ceramic substrate.

In this case, because the metal layer formed of Al or an Al alloy having a relatively low deformation resistance is formed on the other surface of the ceramic substrate, in a case where a stress is applied to the power module substrate, the metal layer is deformed first. Therefore, it is possible to reduce the stress exerted to the ceramic substrate and to inhibit the breaking of the ceramic substrate.

In addition, according to still another aspect of the present invention, there is provided a power module substrate which is the aforementioned bonded body, the power module substrate including a ceramic substrate formed of the ceramic member, a circuit layer formed on one surface of the ceramic substrate, and a metal layer which is formed on the other surface of the ceramic substrate and formed of the Cu member, in which in a bonded interface between the ceramic substrate and the metal layer, a Cu—Sn layer which is positioned on the ceramic substrate side and in which Sn forms a solid solution in Cu, a first intermetallic compound layer which is positioned on the metal layer side and contains Cu and Ti, and a second intermetallic compound layer which is positioned between the first intermetallic compound layer and the Cu—Sn layer and contains P and Ti are formed.

According to the power module substrate as the aspect of the present invention, the first intermetallic compound layer containing Cu and Ti is formed on the metal layer side. Therefore, the metal layer and the second intermetallic compound layer can be reliably bonded to each other, and even though the power module substrate is used in a high-temperature environment, a brazing bonding strength between the metal layer and the ceramic substrate can be secured. Furthermore, because a Ti layer is not formed or a thin Ti layer having a thickness equal to or smaller than 0.5 μm is formed, a thermal resistance in a lamination direction can be kept low, and the heat from a semiconductor element mounted on the circuit layer can be efficiently radiated.

According to still another aspect of the present invention, there is provided a method for manufacturing a bonded body including a ceramic member formed of ceramics and a Cu member formed of Cu or a Cu alloy. The method includes a laminating step of laminating the ceramic member and the Cu member through a Cu—P—Sn-based brazing material and a Ti material, a first heat treatment step of performing heating at a temperature lower than a melting start temperature of the Cu—P—Sn-based brazing material in a state where the ceramic member and the Cu member are laminated so as to cause the Cu member and the Ti material to react with each other and form a first intermetallic compound layer having Cu and Ti, and a second heat treatment step of performing heating after the first heat treatment step at a temperature equal to or higher than the inching start temperature of the Cu—P—Sn-based brazing material so as to form a Cu—Sn layer in which Sn forms a solid solution in Cu and a second intermetallic compound layer which is positioned between the first intermetallic compound layer and the Cu—Sn layer and contains P and Ti.

The method for manufacturing a bonded body constituted as above includes the first heat treatment step of performing heating at a temperature lower than a melting start temperature of the Cu—P—Sn-based brazing material in a laminated state so as to cause the Cu member and the Ti material to react with each other and form a first intermetallic compound layer containing Cu and Ti. Therefore, it is possible to reliably form the first intermetallic compound layer and to reliably bond the Cu member and the Ti material to each other. In the first heat treatment step, a portion of the Ti material is allowed to remain.

Furthermore, the method for manufacturing a bonded body includes the second heat treatment step of performing heating after the first heat treatment step at a temperature equal to or higher than the melting start temperature of the Cu—P—Sn-based brazing material so as to form a Cu—Sn layer in which Sn forms a solid solution in Cu and a second intermetallic compound layer which is positioned between the first intermetallic compound layer and the Cu—Sn layer and contains P and Ti. Therefore, by causing Ti of the Ti material to react with the Cu—P—Sn-based brazing material, it is possible to form the second intermetallic compound layer and to reliably bond the Cu member and the ceramic member to each other. In the second heat treatment step, the Ti material may be totally reacted, or a portion of the Ti material may be allowed to remain such that a Ti layer having a thickness equal to or smaller than 0.5 µm is formed.

In the method for manufacturing a bonded body as the aspect of the present invention described above, a heating temperature in the first heat treatment step is preferably within a range equal to or higher than 580° C. and equal to or lower than 670° C., and a heating time in the first heat treatment step is preferably within a range equal to or longer than 30 minutes and equal to or shorter than 240 minutes.

In this case, because the heating temperature is equal to or higher than 580° C. and the heating time is equal to or longer than 30 minutes, it is possible to reliably form the first intermetallic compound layer. Meanwhile, because the heating temperature is equal to or lower than 670° C. and the heating time is equal to or shorter than 240 minutes, the formed first intermetallic compound layer does not become unnecessarily thick, and it is possible to inhibit the occurrence of breaking in the first intermetallic compound layer.

According to still another aspect of the present invention, there is provided a method for manufacturing a bonded body including a ceramic member formed of ceramics and a Cu member formed of Cu or a Cu alloy. The method includes a CuTi diffusing step of diffusing Cu and Ti by heating the Cu member and the Ti material in a laminated state so as to form a first intermetallic compound layer containing Cu and Ti between the Cu member and the Ti material, a laminating step of laminating the ceramic member and the Ti material and the Cu member, between which the first intermetallic compound layer is formed, through a Cu—P—Sn-based brazing material, and a heat treatment step of performing heating at a temperature equal to or higher than a melting start temperature of the Cu—P—Sn-based brazing material so as to form a Cu—Sn layer in which Sn forms a solid solution in Cu and a second intermetallic compound layer which is positioned between the first intermetallic compound layer and the Cu—Sn layer and contains P and Ti.

The method for manufacturing a bonded body constituted as above includes the CuTi diffusing step of diffusing Cu and Ti by heating the Cu member and the Ti material in a laminated state so as to form a first intermetallic compound layer containing Cu and Ti between the Cu member and the Ti material. Therefore, the first intermetallic compound layer can be reliably formed. In the CuTi diffusing step, a portion of the Ti material is allowed to remain.

Furthermore, in the CuTi diffusing step, the Cu member and the Ti material are laminated and heated without laminating a brazing material thereon. Therefore, it is possible to relatively freely set the heating conditions, to reliably form the first intermetallic compound layer, and to very accurately adjust the thickness of the remaining Ti material.

In addition, the method for manufacturing a bonded body includes the laminating step of laminating the ceramic member and the Ti material and the Cu member, between which the first intermetallic compound layer is formed, through a Cu—P—Sn-based brazing material, and the heat treatment step of performing heating at a temperature equal to or higher than a melting start temperature of the Cu—P—Sn-based brazing material so as to form a Cu—Sn layer in which Sn forms a solid solution in Cu and a second intermetallic compound layer which is positioned between the first intermetallic compound layer and the Cu—Sn layer and contains P and Ti. Therefore, by causing Ti of the Ti material to react with the Cu—P—Sn-based brazing material, it is possible to form the second intermetallic compound layer and to reliably bond the Cu member and the ceramic member to each other. In the second heat treatment step, the Ti material may be totally reacted, or a portion of the Ti material may be allowed to remain such that a Ti layer having a thickness equal to or smaller than 0.5 µm is formed.

In the method for manufacturing a bonded body as the aspect of the present invention described above, a heating temperature in the CuTi diffusing step is preferably within a range equal to or higher than 600° C. and equal to or lower than 670° C., and a heating time in the CuTi diffusing step is preferably within a range equal to or longer than 30 minutes and equal to or shorter than 360 minutes.

In this case, because the heating temperature is equal to or higher than 600° C. and the heating time is equal to or longer than 30 minutes, the first intermetallic compound layer can be reliably formed. Meanwhile, because the heating temperature is equal to or lower than 670° C. and the heating time is equal to or shorter than 360 minutes, the formed first intermetallic compound layer does not become unnecessarily thick, and it is possible to inhibit the first intermetallic compound layer from becoming a starting point of breaking.

Furthermore, in the method for manufacturing a bonded body of the present invention described above, a load in a lamination direction in the CuTi diffusing step may be within a range equal to or higher than 0.294 MPa and equal to or lower than 1.96 MPa.

In this case, because the load is within a range equal to or higher than 0.294 MPa and equal to or lower than 1.96 MPa, the first intermetallic compound layer can be reliably formed, and the brazing bonding strength can be further increased. The load is preferably within a range equal to or higher than 0.490 MPa and equal to or lower than 1.47 MPa, and more preferably within a range equal to or higher than 1.18 MPa and equal to or lower than 1.47 MPa.

According to still another aspect of the present invention, there is provided a method for manufacturing a power module substrate in which a circuit layer formed of Cu or a Cu alloy is provided on one surface of a ceramic substrate. The method includes bonding the ceramic substrate and the circuit layer to each other by the aforementioned method for manufacturing a bonded body.

According to the method for manufacturing a power module substrate constituted as above, in a bonded interface between the circuit layer and the ceramic substrate, a Cu—Sn layer which is positioned on the ceramic substrate side and in which Sn forms a solid solution in Cu, a first intermetallic compound layer which is positioned on the circuit layer side and has Cu and Ti, and a second intermetallic compound layer which is positioned between the first intermetallic compound layer and the Cu—Sn layer and contains P and Ti can be formed. Therefore, it is possible to reliably bond the circuit layer and the ceramic substrate to each other and to manufacture a power module substrate which exhibits a low thermal resistance in a lamination direction and enables heat to be efficiently radiated.

According to still another aspect of the present invention, there is provided a method for manufacturing a power module substrate in which a circuit layer is provided on one surface of a ceramic substrate and a metal layer formed of Cu or a Cu alloy is provided on the other surface of the ceramic substrate. The method includes bonding the ceramic substrate and the metal layer to each other by the aforementioned method for manufacturing a bonded body.

According to the method for manufacturing a power module substrate constituted as above, in a bonded interface between the metal layer and the ceramic substrate, a Cu—Sn layer which is positioned on the ceramic substrate side and in which Sn forms a solid solution in Cu, a first intermetallic compound layer which is positioned on the circuit layer side and has Cu and Ti, and a second intermetallic compound layer which is positioned between the first intermetallic compound layer and the Cu—Sn layer and contains P and Ti can be formed. Therefore, it is possible to reliably bond the metal layer and the ceramic substrate to each other and to manufacture a power module substrate which exhibits a low thermal resistance in a lamination direction and enables heat to be efficiently radiated.

According to still another aspect of the present invention, there is provided a method for manufacturing a power module substrate in which a circuit layer formed of Cu or a Cu alloy is provided on one surface of a ceramic substrate and a metal layer formed of Al or an Al alloy is provided on the other surface of the ceramic substrate. The method includes bonding the ceramic substrate and the circuit layer to each other by the aforementioned method for manufacturing a bonded body.

According to the method for manufacturing a power module substrate constituted as above, in a bonded interface between the circuit layer and the ceramic substrate, a Cu—Sn layer which is positioned on the ceramic substrate side and in which Sn forms a solid solution in Cu, a first intermetallic compound layer which is positioned on the circuit layer side and has Cu and Ti, and a second intermetallic compound layer which is positioned between the first intermetallic compound layer and the Cu—Sn layer and contains P and Ti can be formed. Therefore, it is possible to reliably bond the circuit layer and the ceramic substrate to each other and to manufacture a power module substrate which exhibits a low thermal resistance in a lamination direction and enables heat to be efficiently radiated.

Furthermore, because the circuit layer formed of Cu or a Cu alloy and the ceramic substrate can be bonded to each other at a relatively low temperature, it is possible to simultaneously bond the circuit layer formed of Cu or a Cu alloy, the ceramic substrate, and the metal layer formed of Al or an Al alloy to each other.

Advantageous Effects of Invention

According to the present invention, it is possible to provide a bonded body, in which a ceramic member and a Cu member are excellently bonded to each other and which exhibits a low thermal resistance in a lamination direction, a power module substrate, a method for manufacturing the bonded body, and a method for manufacturing a power module substrate.

DESCRIPTION OF EMBODIMENTS

First Embodiment

Hereinafter, embodiments of the present invention will be described with reference to the attached drawings. First, a first embodiment of the present invention will be described.

Figure 1:
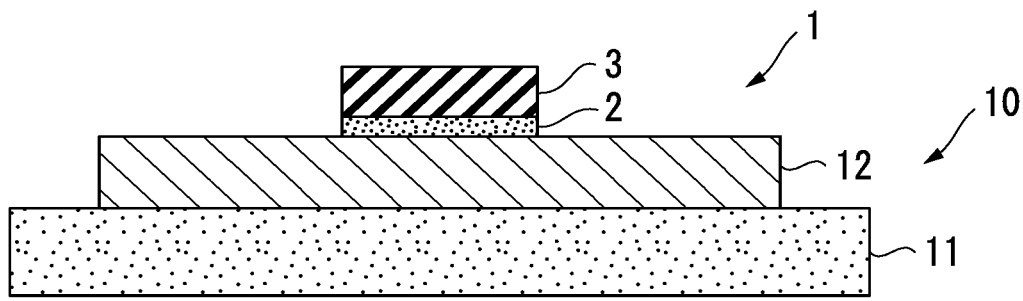
FIG. 1 is a view schematically describing a power module in which a power module substrate according to a first embodiment of the present invention is used.

A bonded body according to the present embodiment is a substrate 10 for a power module in which a ceramic substrate 11 as a ceramic member and a Cu foil 22 (circuit layer 12) as a Cu member are bonded to each other. FIG. 1 shows a power module 1 including the substrate 10 for a power module as the present embodiment.

The power module 1 includes the substrate 10 for a power module provided with the circuit layer 12 and a semiconductor element 3 bonded to one surface (upper surface in FIG. 1) of the circuit layer 12 through a bonding layer 2.

Figure 2:
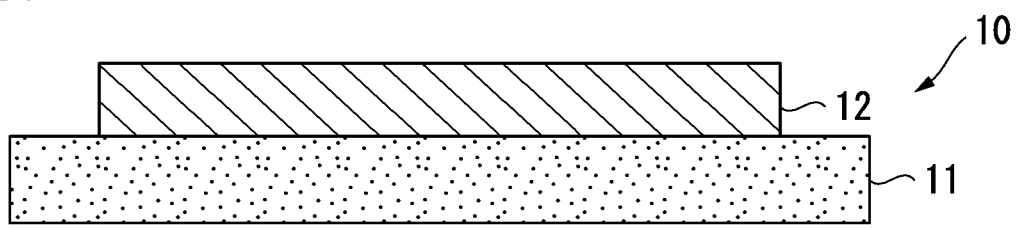
FIG. 2 is a view schematically describing the power module substrate according to the first embodiment of the present invention.

As shown in FIG. 2, the substrate 10 for a power module includes the ceramic substrate 11 and the circuit layer 12 provided on one surface (upper surface in FIG. 2) of the ceramic substrate 11.

The ceramic substrate 11 is constituted with ceramics such as aluminum nitride (AlN), silicon nitride ($Si_3N_4$), and alumina ($Al_2O_3$) having high insulating properties. In the present embodiment, the ceramic substrate 11 is constituted with aluminum nitride (AlN) having excellent heat radiation properties. The thickness of the ceramic substrate 11 is set within a range of 0.2 to 1.5 mm. In the present embodiment, the thickness of the ceramic substrate 11 is set to be 0.635 mm.

The circuit layer 12 is formed by bonding a metal sheet formed of Cu or a Cu alloy having conductivity to one surface of the ceramic substrate 11.

Figure 5:
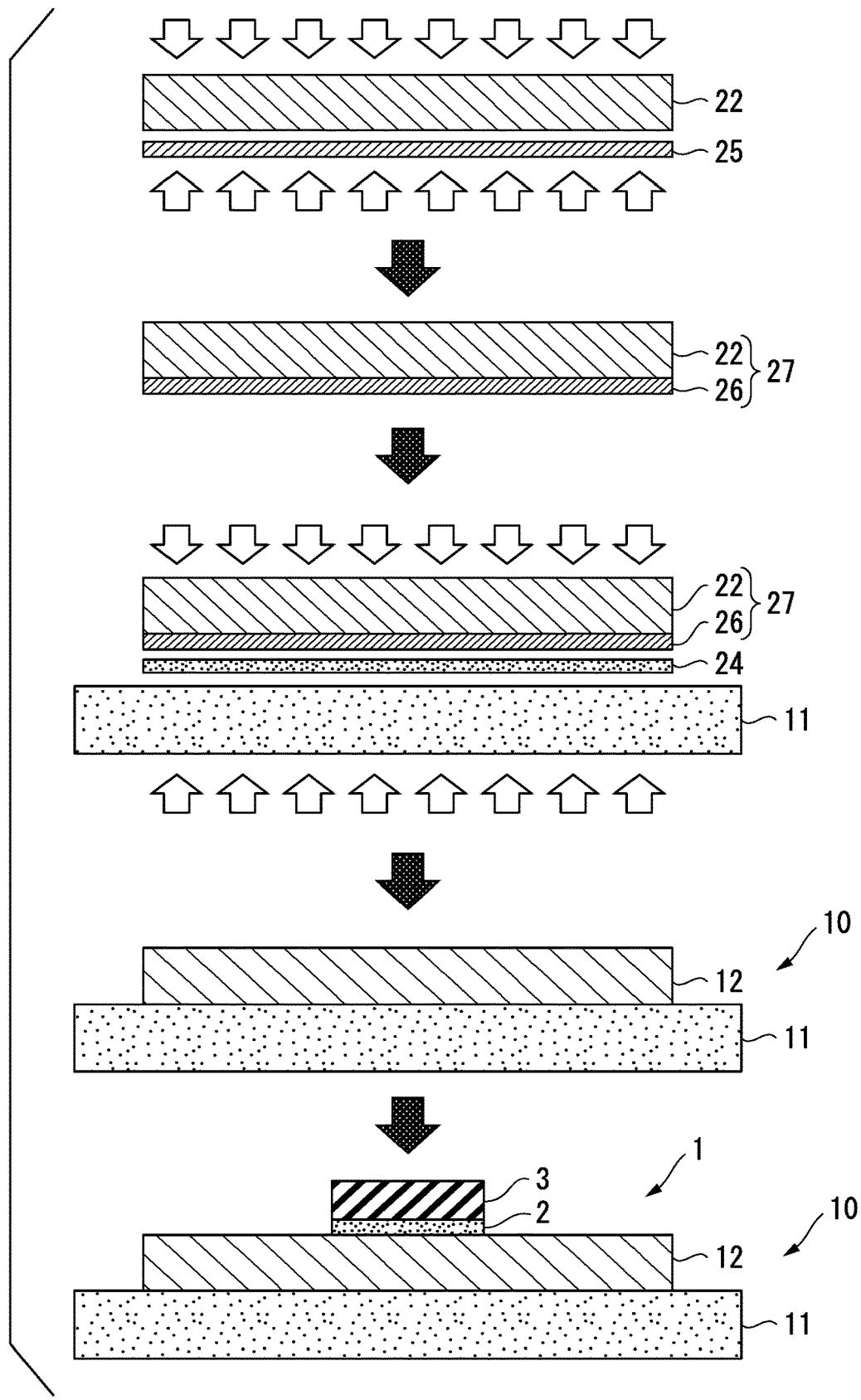
FIG. 5 is a view schematically describing the method for manufacturing the power module substrate and the method for manufacturing a power module according to the first embodiment of the present invention.

In the present embodiment, the circuit layer 12 is formed by laminating a Cu—P—Sn-based brazing material 24 and the Cu foil 22 formed of oxygen-free copper, to which a Ti material 25 is bonded, on one surface of the ceramic substrate 11 and performing a heat treatment such that the Cu foil 22 is bonded to the ceramic substrate 11 (see FIG. 5). In the present embodiment, as the Cu—P—Sn-based brazing material 24, a Cu—P—Sn—Ni brazing material is used.

A structure in which Sn is diffused in Cu is established on the ceramic substrate 11 side on the circuit layer 12.

The thickness of the circuit layer 12 is set within a range equal to or greater than 0.1 mm and equal to or smaller than 1.0 mm. In the present embodiment, the thickness of the circuit layer 12 is set to be 0.3 mm.

Figure 3:
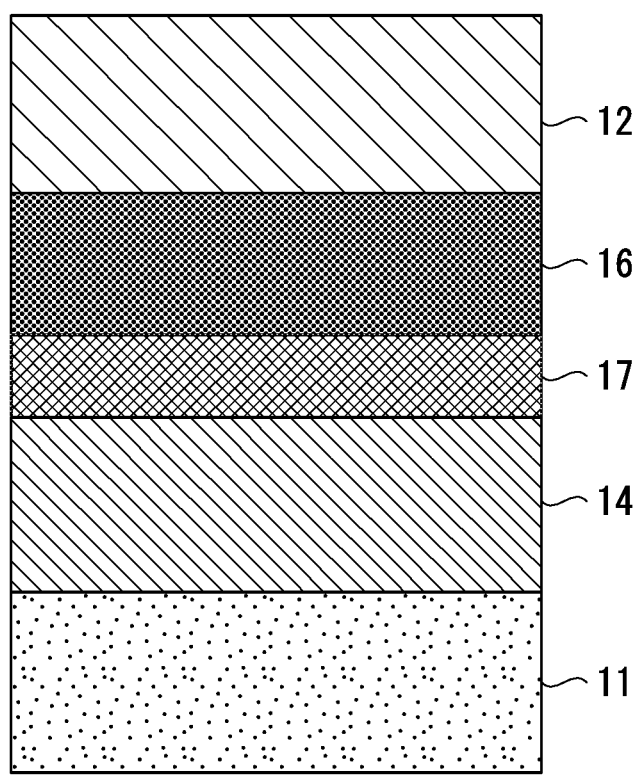
FIG. 3 is a cross-sectional view schematically describing a bonded interface between a circuit layer and a ceramic substrate in the power module substrate shown in FIG. 2.

FIG. 3 is a view schematically describing a bonded interface between the ceramic substrate 11 and the circuit layer 12. As shown in FIG. 3, in the bonded interface between the ceramic substrate 11 and the circuit layer 12, a Cu—Sn layer 14 which is positioned on the ceramic substrate 11 side, a first intermetallic compound layer 16 which is positioned on the circuit layer 12 side and contains Cu and Ti, and a second intermetallic compound layer 17 which is positioned between the first intermetallic compound layer 16 and the Cu—Sn layer 14 and contains P and Ti are formed.

The Cu—Sn layer 14 is a layer in which Sn forms a solid solution in Cu. By the incorporation of P contained in the Cu—P—Sn-based brazing material 24 into the second intermetallic compound layer 17, the Cu—Sn layer 14 is formed.

The first intermetallic compound layer 16 is a layer formed by the interdiffusion between Cu of the circuit layer 12 and Ti of the Ti material 25. Herein, the diffusion of Cu and Ti is diffusion in solids.

Specifically, the first intermetallic compound layer 16 has one or more phases among a $Cu_4Ti$ phase, a $Cu_3Ti_2$ phase, a $Cu_4Ti_3$ phase, a $CuTi$ phase, and a $CuTi_2$ phase. In the present embodiment, the first intermetallic compound layer 16 has a $Cu_4Ti$ phase, a $Cu_3Ti_2$ phase, a $Cu_4Ti_3$ phase, a $CuTi$ phase, and a $CuTi_2$ phase.

Furthermore, in the present embodiment, the thickness of the first intermetallic compound layer 16 is set within a range equal to or greater than 0.2 μm and equal to or smaller than 6 μm.

The second intermetallic compound layer 17 is formed by bonding of P contained in the Cu—P—Sn-based brazing material 24 to Ti contained in the Ti material 25. In the present embodiment, the Cu—P—Sn-based brazing material 24 contains Ni. Therefore, the second intermetallic compound layer 17 has one or more kinds of phases among a P—Ni—Ti phase, a P—Ti phase, and a Cu—Ni—Ti phase. Specifically, the second intermetallic compound layer 17 has a P—Ni—Ti phase.

Furthermore, in the present embodiment, the thickness of the second intermetallic compound layer 17 is within a range equal to or greater than 0.5 μm and equal to or smaller than 4 μm.

The semiconductor element 3 is constituted with a semiconductor material such as Si. The semiconductor element 3 and the circuit layer 12 are bonded to each other through a bonding layer 2.

The bonding layer 2 is formed of a solder material based on Sn—Ag, Sn—In, or Sn—Ag—Cu, for example.

Figure 4:
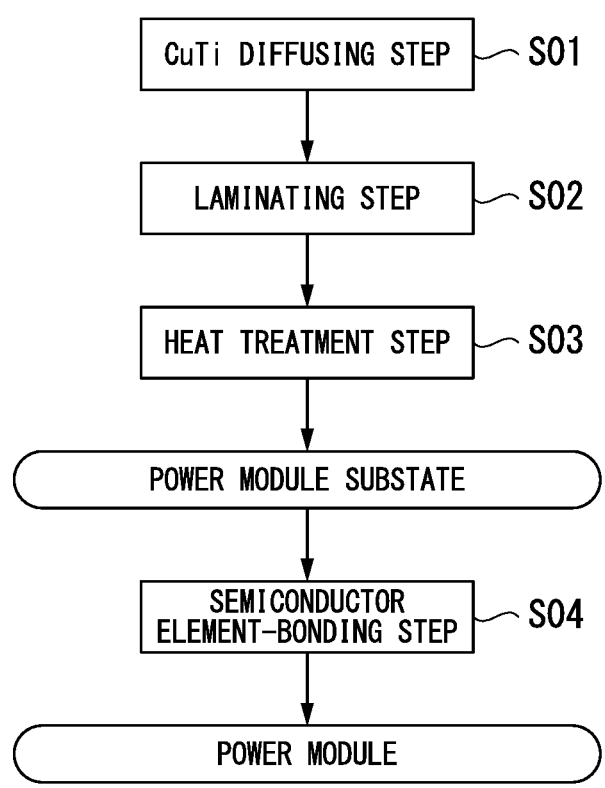
FIG. 4 is a flowchart describing a method for manufacturing the power module substrate and a method for manufacturing a power module according to the first embodiment of the present invention.

Hereinafter, methods for manufacturing the substrate 10 for a power module and the power module 1 according to the present embodiment will be described with reference to the flowchart shown in FIG. 4 and FIG. 5.

First, as shown in FIG. 5, the Cu foil 22 which will become the circuit layer 12 and the Ti material 25 are laminated, disposed in a vacuum heating furnace in a state where pressure (1 to 35 kgf/cm$^2$) is applied thereto in the lamination direction, and heated such that the Cu foil 22 and the Ti material 25 are bonded to each other by diffusion in solids, thereby obtaining a Cu—Ti bonded body 27 (CuTi diffusing step S01).

The thickness of the Ti material 25 is within a range equal to or greater than 0.4 μm and equal to or smaller than 5 μm. In a case where the thickness of the Ti material 25 is equal to or greater than 0.4 μm and less than 1 μm, it is preferable that the Ti material 25 is deposited by vapor deposition or sputtering. In a case where the thickness of the Ti material 25 is equal to or greater than 1 μm and equal to or smaller than 5 μm, it is preferable to use a foil material. The lower limit of the thickness of the Ti material 25 is preferably equal to or greater than 0.4 μm, and more preferably equal to or greater than 0.5 μm. The upper limit of the thickness of the Ti material 25 is preferably equal to or smaller than 1.5 μm, and more preferably equal to or smaller than 0.7 μm. In the present embodiment, as the Ti material 25, a Ti foil having a thickness of 1 μm and a purity of 99.8 mass % is used.

In the Cu—Ti bonded body 27 obtained by the CuTi diffusing step S01, the Ti material 25 and the Cu foil 22 are bonded to each other by diffusion in solids, and a laminated structure of the Cu foil 22 and an intermediate Ti layer 26 is established. Between the intermediate Ti layer 26 and the Cu foil 22, a first intermediate intermetallic compound layer containing Cu and Ti is formed. At this time, not all the Ti material 25 is consumed for forming the first intermediate intermetallic compound layer, and a portion of the Ti material 25 remains.

In the present embodiment, the thickness of the intermediate Ti layer 26 is within a range equal to or greater than 0.1 μm and equal to or smaller than 3 μm. The lower limit of the thickness of the intermediate Ti layer 26 is preferably equal to or greater than 0.2 μm, and more preferably equal to or greater than 0.4 μm. The upper limit of the thickness of the intermediate Ti layer 26 is preferably equal to or smaller than 1.5 μm, and more preferably equal to or smaller than 1 μm.

Furthermore, the thickness of the first intermediate intermetallic compound layer is preferably equal to or greater than 0.1 μm and equal to or smaller than 6 μm.

In the CuTi diffusing step S01, the internal pressure of the vacuum heating furnace is set within a range equal to or higher than $10^{-6}$ Pa and equal to or lower than $10^{-3}$ Pa, the heating temperature is set within a range equal to or higher than 600° C. and equal to or lower than 670° C., and the heating time is set within a range equal to or longer than 30 minutes and equal to or shorter than 360 minutes.

In the CuTi diffusing step S01, in a case where the heating temperature is set to be equal to or higher than 600° C. and the heating time is set to be equal to or longer than 30 minutes, the first intermediate intermetallic compound layer can be sufficiently formed. Furthermore, in a case where the heating temperature is set to be equal to or lower than 670° C., and the heating time is set to be equal to or shorter than 360 minutes, it is possible to inhibit the formed first intermediate intermetallic compound layer from becoming unnecessarily thick.

The lower limit of the heating temperature is preferably equal to or higher than 610° C., and more preferably equal to or higher than 620° C. The upper limit of the heating temperature is preferably equal to or lower than 650° C., and more preferably equal to or lower than 640° C. Furthermore, the lower limit of the heating time is preferably equal to or longer than 15 minutes, and more preferably equal to or longer than 60 minutes. The upper limit of the heating time is preferably equal to or shorter than 120 minutes, and more preferably equal to or shorter than 90 minutes.

In order to more strongly bond the Cu foil 22 and the Ti material 25 to each other, in the CuTi diffusing step S01, the load applied in the lamination direction is preferably within a range equal to or higher than 0.294 MPa and equal to or lower than 1.96 MPa (equal to or higher than 3 kgf/cm² and equal to or lower than 20 kgf/cm²). The load is more preferably within a range equal to or higher than 0.490 MPa and equal to or lower than 1.47 MPa, and even more preferably within a range equal to or higher than 1.18 MPa and equal to or lower than 1.47 MPa.

Then, the Cu—P—Sn-based brazing material 24 and the Cu—Ti bonded body 27 are laminated in this order on one surface (upper surface in FIG. 5) of the ceramic substrate 11 (laminating step S02). At this time, the Cu—Ti bonded body 27 is laminated such that the intermediate Ti layer 26 and the Cu—P—Sn-based brazing material 24 face each other.

In the present embodiment, the composition of the Cu—P—Sn-based brazing material 24 is Cu—7 mass % P—15 mass % Sn—10 mass % Ni. The solidus temperature (melting start temperature) of the Cu—P—Sn-based brazing material 24 is 580° C. Furthermore, as the Cu—P—Sn-based brazing material 24, a foil material is used, and the thickness thereof is within a range equal to or greater than 5 μm and equal to or smaller than 150 μm.

Thereafter, the ceramic substrate 11, the Cu—P—Sn-based brazing material 24, and the Cu—Ti bonded body 27 are put into a vacuum heating furnace in a state where pressure (1 to 35 kgf/cm²) is applied thereto in the lamination direction, and heated (heat treatment step S03).

In the present embodiment, as conditions of the heat treatment step S03, the internal pressure of the vacuum heating furnace is set within a range equal to or higher than $10^{-6}$ Pa and equal to or lower than $10^{-3}$ Pa, the heating temperature is set within a range equal to or higher than 600° C. and equal to or lower than 700° C., and the heating time is set within a range equal to or longer than 15 minutes and equal to or shorter than 120 minutes.

In the heat treatment step S03, the Cu—P—Sn-based brazing material 24 is melted and forms a liquid phase. The intermediate Ti layer 26 is melted into the liquid phase, and the liquid phase is solidified. As a result, the ceramic substrate 11 and the Cu foil 22 are bonded to each other. At this time, P and Ni contained in the Cu—P—Sn-based brazing material 24 are bonded to Ti of the intermediate Ti layer 26. Consequently, the second intermetallic compound layer 17 is formed, and the Cu—Sn layer 14 is formed on the ceramic substrate 11 side. The first intermetallic compound layer 16 is formed by the remaining first intermediate intermetallic compound layer.

In the present embodiment, the thickness of the intermediate Ti layer 26 is within a range equal to or greater than 0.1 μm and equal to or smaller than 3 μm. Accordingly, the intermediate Ti layer 26 is totally melted into the liquid phase of the Cu—P—Sn-based brazing material 24, and no intermediate Ti layer 26 remains in the bonded interface between the ceramic substrate 11 and the circuit layer 12.

As a result, the circuit layer 12 is formed on one surface of the ceramic substrate 11, and the substrate 10 for a power module as the present embodiment is manufactured.

Then, the semiconductor element 3 is bonded to the upper surface of the circuit layer 12 of the substrate 10 for a power module through a solder material (semiconductor element-bonding step S04).

In this way, the power module 1 according to the present embodiment is manufactured.

According to the substrate 10 for a power module of the present embodiment constituted as above, in the bonded interface between the ceramic substrate 11 and the circuit layer 12, the first intermetallic compound layer 16 which is positioned on the circuit layer 12 side and contains Cu and Ti is formed. Therefore, through the first intermetallic compound layer 16, the circuit layer 12 and the second intermetallic compound layer 17 can be reliably bonded to each other. As a result, even though the substrate 10 for a power module is used in a high-temperature environment, the brazing bonding strength between the circuit layer 12 and the ceramic substrate 11 can be secured.

Furthermore, the Ti layer is not formed in the bonded interface between the ceramic substrate 11 and the circuit layer 12. Accordingly, the thermal resistance in the lamination direction of the circuit layer 12 and the ceramic substrate 11 can be kept low, and the heat generated from the semiconductor element 3 mounted on the circuit layer 12 can be efficiently radiated.

In the present embodiment, the thickness of the first intermetallic compound layer 16 is equal to or greater than 0.2 μm. Therefore, the brazing bonding strength between the circuit layer 12 and the ceramic substrate 11 can be reliably improved. Meanwhile, because the thickness of the first intermetallic compound layer 16 is equal to or smaller than 6 μm, it is possible to inhibit the occurrence of breaking in the first intermetallic compound layer 16.

In order to reliably improve the brazing bonding strength between the circuit layer 12 and the ceramic substrate 11, the lower limit of the thickness of the first intermetallic compound layer 16 is preferably equal to or greater than 0.5 μm, and more preferably equal to or greater than 1 μm. Furthermore, in order to reliably inhibit the occurrence of breaking in the first intermetallic compound layer 16, the upper limit of the thickness of the first intermetallic compound layer 16 is preferably equal to or smaller than 5 μm, and more preferably equal to or smaller than 3 μm. Note that because sometimes the diffusion of Ti proceeds due to the heating in the heat treatment step S03, the thickness of the first intermetallic compound layer 16 becomes larger than the thickness of the first intermediate intermetallic compound layer.

In the present embodiment, the thickness of the second intermetallic compound layer 17 is equal to or greater than 0.5 µm. Accordingly, the brazing bonding strength between the circuit layer 12 and the ceramic substrate 11 can be reliably improved. Meanwhile, because the thickness of the second intermetallic compound layer 17 is equal to or smaller than 4 µm, it is possible to inhibit the occurrence of breaking in the second intermetallic compound layer 17.

In order to reliably improve the brazing bonding strength between the circuit layer 12 and the ceramic substrate 11, the lower limit of the thickness of the second intermetallic compound layer 17 is preferably equal to or greater than 1 µm, and more preferably equal to or greater than 2 µm. Furthermore, in order to reliably inhibit the occurrence of breaking in the second intermetallic compound layer 17, the upper limit of the thickness of the second intermetallic compound layer 17 is preferably equal to or smaller than 3.5 µm, and more preferably equal to or smaller than 3 µm.

The method for manufacturing the power module substrate of the present embodiment includes the CuTi diffusing step S01 in which the Cu foil 22 which will become the circuit layer 12 and the Ti material 25 are laminated, disposed in a vacuum heating furnace in a state where pressure (1 to 35 kgf/cm$^2$) is applied thereto in the lamination direction, and heated so as to bond the Cu foil 22 and the Ti material 25 to each other by diffusion in solids and to obtain the Cu—Ti bonded body 27. Accordingly, it is possible to reliably form the first intermediate intermetallic compound layer containing Cu and Ti between the Cu foil 22 and the intermediate Ti layer 26.

The thickness of the intermediate Ti layer 26 is within a range equal to or greater than 0.1 µm and equal to or smaller than 3 µm. Accordingly, in the heat treatment step S03 as the next step, the intermediate Ti layer 26 and the Cu—P—Sn-based brazing material 24 can be reacted with each other.

In addition, in the CuTi diffusing step S01, while the Cu foil 22 and the Ti material 25 are laminated and heated, the Cu—P—Sn-based brazing material 24 is not laminated. Accordingly, the heating temperature and the heating time can be relatively freely set.

The method for manufacturing the power module substrate of the present embodiment also includes the heat treatment step S03 of putting the ceramic substrate 11, the Cu—P—Sn-based brazing material 24, and the Cu—Ti bonded body 27 into a vacuum heating furnace in a state where pressure (1 to 35 kgf/cm$^2$) is applied thereto in the lamination direction, and performing heating. Accordingly, by reacting Ti of the intermediate Ti layer 26 with the Cu—P—Sn-based brazing material 24, it is possible to form the second intermetallic compound layer 17 and to reliably bond the circuit layer 12 and the ceramic substrate 11 to each other.

In a case where the pressure applied in the heat treatment step S03 is equal to or higher than 1 kgf/cm$^2$, it is possible to bring the ceramic substrate 11 into close contact with the liquid phase of the Cu—P—Sn-based brazing material 24 and to excellently bond the ceramic substrate 11 and the Cu—Sn layer 14 to each other. In addition, in a case where the applied pressure is equal to or lower than 35 kgf/cm$^2$, the occurrence of breaking in the ceramic substrate 11 can be inhibited. For these reasons, in the present embodiment, the applied pressure is set within a range equal to or higher than 1 kgf/cm$^2$ and equal to or lower than 35 kgf/cm$^2$.

Second Embodiment

Next, a second embodiment of the present invention will be described. Note that the same constituents as those in the first embodiment will be described using the same reference signs and will not be specifically described.

Figure 6:
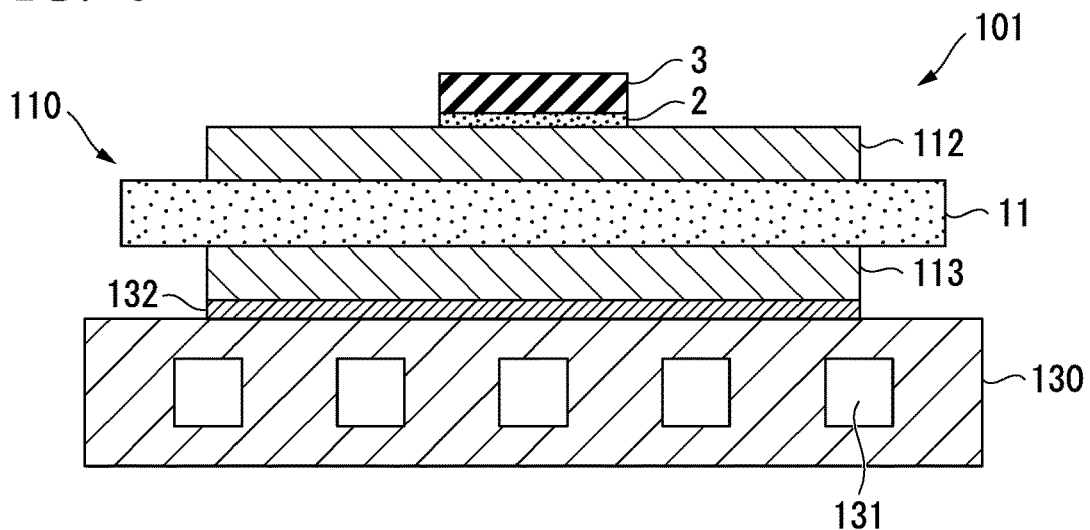
FIG. 6 is a view schematically describing a power module in which a power module substrate according to a second embodiment of the present invention is used.

FIG. 6 shows a power module 101 including a substrate 110 for a power module according to the second embodiment.

The power module 101 includes the substrate 110 for a power module provided with a circuit layer 112 and a metal layer 113, the semiconductor element 3 bonded to one surface (upper surface in FIG. 6) of the circuit layer 112 through the bonding layer 2, and a heat sink 130 disposed on the other side (lower side in FIG. 6) of the metal layer 113.

Figure 7:
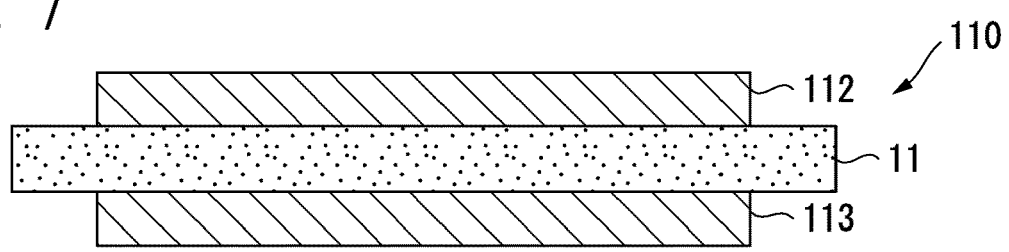
FIG. 7 is a view schematically describing the power module substrate according to the second embodiment of the present invention.

As shown in FIG. 7, the substrate 110 for a power module includes the ceramic substrate 11, the circuit layer 112 provided on one surface (upper surface in FIG. 7) of the ceramic substrate 11, and the metal layer 113 provided on the other surface (lower surface in FIG. 7) of the ceramic substrate 11.

The ceramic substrate 11 is constituted with aluminum nitride (AlN) having excellent heat radiation properties as in the first embodiment.

Figure 10:
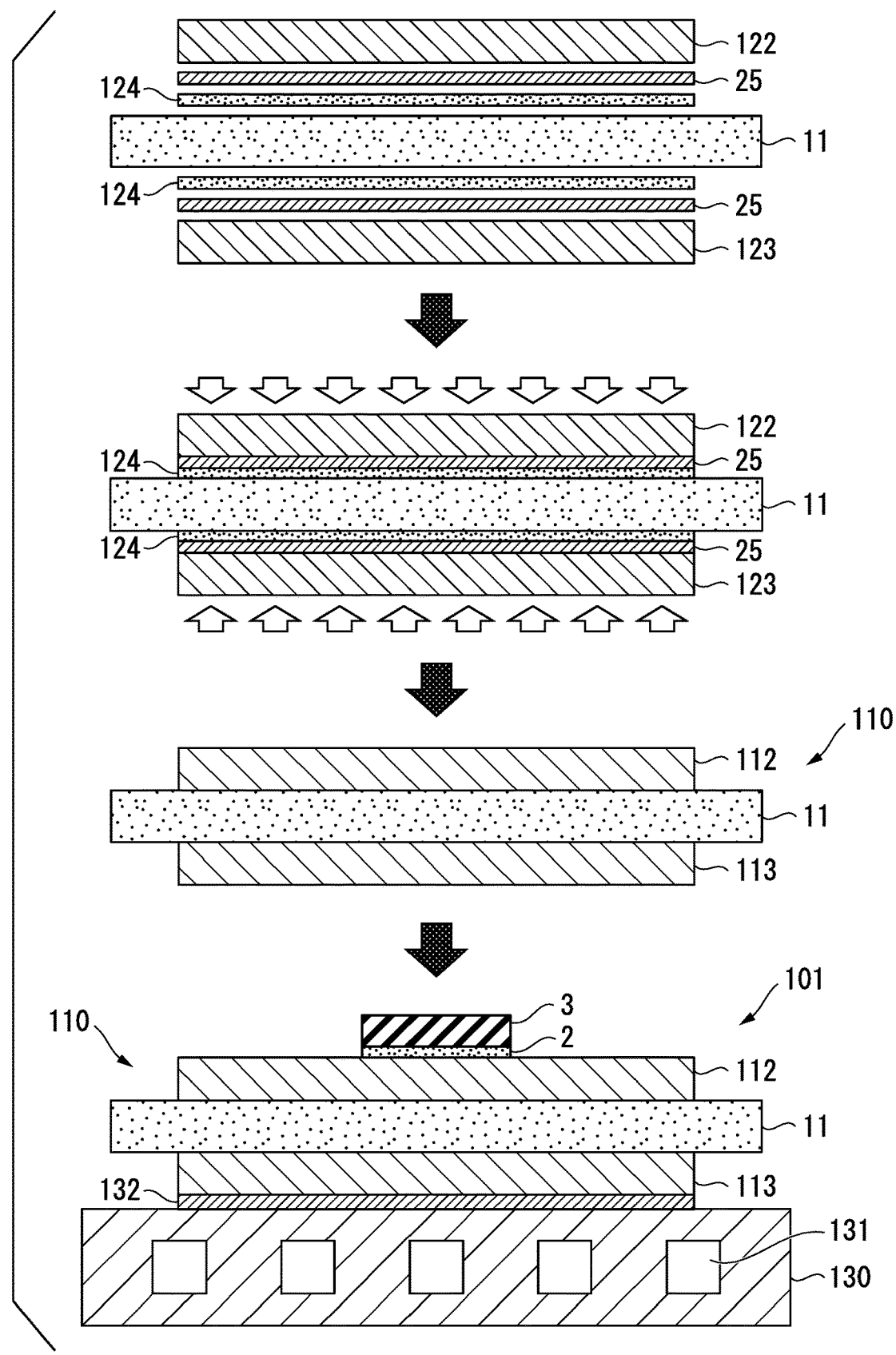
FIG. 10 is a view schematically describing the method for manufacturing the power module substrate and the method for manufacturing a power module according to the second embodiment of the present invention.

As in the first embodiment, the circuit layer 112 is formed by laminating a Cu—P—Sn-based brazing material 124, the Ti material 25, and a Cu foil 122 formed of oxygen-free copper in this order on one surface of the ceramic substrate 11, and performing a heat treatment so as to bond the Cu foil 122 to the ceramic substrate 11 (see FIG. 10).

The thickness of the circuit layer 112 is set within a range equal to or greater than 0.1 mm and equal to or smaller than 1.0 mm. In the present embodiment, the thickness of the circuit layer 112 is set to be 0.3 mm.

By bonding a metal sheet of Cu or a Cu alloy to the other surface of the ceramic substrate 11 through the Cu—P—Sn-based brazing material 124, the metal layer 113 is formed. In the present embodiment, by laminating the Cu—P—Sn-based brazing material 124, the Ti material 25, and a Cu foil 123 formed of oxygen-free copper on the other surface of the ceramic substrate 11 and performing a heat treatment so as to bond the Cu foil 123 to the ceramic substrate 11, the metal layer 113 is formed (see FIG. 10).

The thickness of the metal layer 113 is set within a range equal to or greater than 0.1 mm and equal to or smaller than 1.0 mm. In the present embodiment, the thickness of the metal layer 113 is set to be 0.3 mm.

In the present embodiment, as the Cu—P—Sn-based brazing material 124, specifically, a Cu—P—Sn—Ni brazing material is used.

Figure 8:
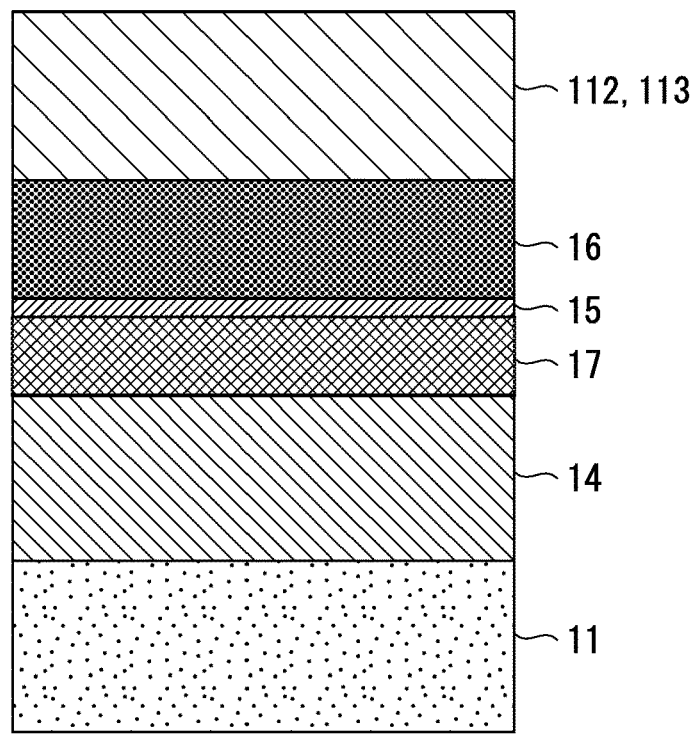
FIG. 8 is a schematic cross-sectional view of a bonded interface between a circuit layer as well as a metal layer and a ceramic substrate in the power module substrate shown in FIG. 7.

FIG. 8 is a view schematically describing the bonded interface between the ceramic substrate 11 and the circuit layer 112 (metal layer 113). As shown in FIG. 8, in the bonded interface between the ceramic substrate 11 and the circuit layer 112 (metal layer 113), the Cu—Sn layer 14 which is positioned on a ceramic substrate 111 side, the first intermetallic compound layer 16 which is positioned on the circuit layer 112 (metal layer 113) side and contains Cu and Ti, and the second intermetallic compound layer 17 which is positioned between the first intermetallic compound layer 16 and the Cu—Sn layer 14 and contains P and Ti are formed.

In the present embodiment, a Ti layer 15 is formed between the first intermetallic compound layer 16 and the second intermetallic compound layer 17. The thickness of the Ti layer 15 is equal to or smaller than 0.5 µm.

Furthermore, in the present embodiment, the thickness of the first intermetallic compound layer 16 is within a range equal to or greater than 0.2 µm and equal to or smaller than 6 µm.

In addition, in the present embodiment, the thickness of the second intermetallic compound layer 17 is within a range equal to or greater than 0.5 μm and equal to or smaller than 4 μm.

The heat sink 130 dissipates the heat from the aforementioned substrate 110 for a power module. The heat sink 130 is constituted with Cu or a Cu alloy. In the present embodiment, the heat sink 130 is constituted with phosphorus deoxidized copper. The heat sink 130 is provided with passages 131 for a cooling fluid to flow through the passages. In the present embodiment, the heat sink 130 and the metal layer 113 are bonded to each other by a solder layer 132 formed of a solder material.

Figure 9:
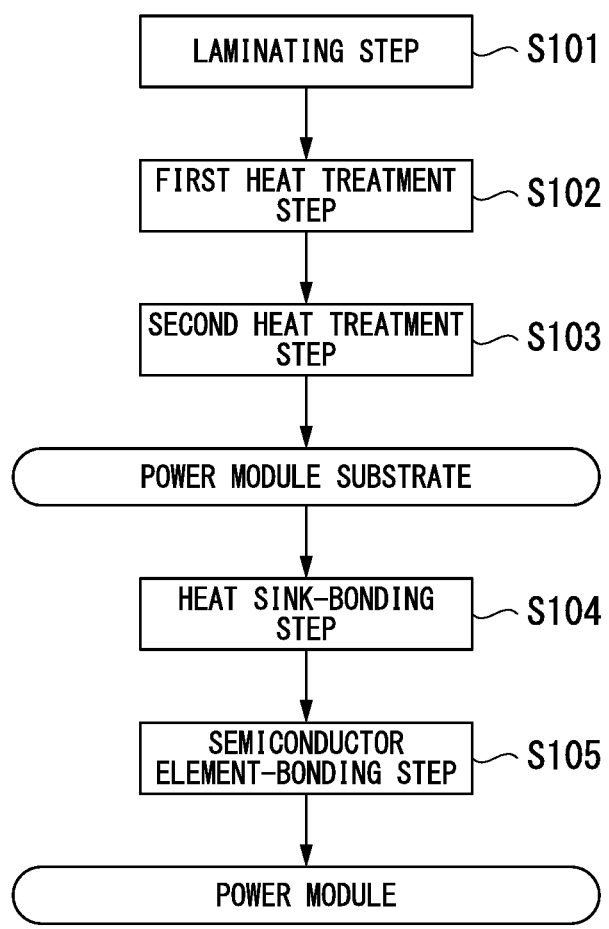
FIG. 9 is a flowchart describing a method for manufacturing the power module substrate and a method for manufacturing a power module according to the second embodiment of the present invention.

Hereinafter, a method for manufacturing the power module 101 according to the present embodiment will be described with reference to the flowchart in FIG. 9 and FIG. 10.

First, as shown in FIG. 10, the Cu—P—Sn-based brazing material 124, the Ti material 25, and the Cu foil 122 which will become the circuit layer 112 are laminated in this order on one surface (upper surface in FIG. 10) of the ceramic substrate 11, and the Cu—P—Sn-based brazing material 124, the Ti material 25, and the Cu foil 123 which will become the metal layer 113 are laminated in this order on the other surface (lower surface in FIG. 10) of the ceramic substrate 11 (laminating step S101). That is, between the ceramic substrate 11 and the Cu foil 122 and between the ceramic substrate 11 and the Cu foil 123, the Cu—P—Sn-based brazing material 124 is disposed on the ceramic substrate 11 side, and the Ti material 25 is disposed on the Cu foil 122 side and the Cu foil 123 side.

In the present embodiment, the composition of the Cu—P—Sn-based brazing material 124 is Cu—6.3 mass % P—9.3 mass % Sn—7 mass % Ni. The solidus temperature (melting start temperature) of the Cu—P—Sn-based brazing material 124 is 600° C. Furthermore, as the Cu—P—Sn-based brazing material 124, a foil material is used, and the thickness thereof is within a range equal to or greater than 5 μm and equal to or smaller than 150 μm.

The thickness of the Ti material 25 is within a range equal to or greater than 0.4 μm and equal to or smaller than 5 μm. In a case where the thickness of the Ti material 25 is equal to or greater than 0.4 μm and less than 1 μm, it is preferable to deposit the Ti material 25 by vapor deposition or sputtering. In a case where the thickness of the Ti material 25 is equal to or greater than 1 μm and equal to or smaller than 5 μm, it is preferable to use a foil material. The lower limit of the thickness of the Ti material 25 is preferably equal to or greater than 0.4 μm, and more preferably equal to or greater than 0.5 μm. The upper limit of the thickness of the Ti material 25 is preferably equal to or smaller than 1.5 μm, and more preferably equal to or smaller than 0.7 μm. In the present embodiment, as the Ti material 25, a Ti foil having a thickness of 1 μm and a purity of 99.8 mass % is used.

Then, the Cu foil 122, the Ti material 25, the Cu—P—Sn-based brazing material 124, the ceramic substrate 11, the Cu—P—Sn-based brazing material 124, the Ti material 25, and the Cu foil 123 are put into a vacuum heating furnace in a state where pressure (equal to or higher than 1 kgf/cm² and equal to or lower than 35 kgf/cm²) is applied thereto in the lamination direction, and heated at a temperature lower than the melting start temperature of the Cu—P—Sn-based brazing material 124 (first heat treatment step S102).

In the first heat treatment step S102, the bonding of the Ti material 25 to the Cu foil 122 and the bonding of the Ti material 25 to the Cu foil 123 are performed by diffusion in solids, and the first intermetallic compound layer 16 containing Cu and Ti is formed between the Ti material 25 and the Cu foil 122 and between the Ti material 25 and the Cu foil 123.

In the present embodiment, the internal pressure of the vacuum heating furnace is set within a range equal to or higher than $10^{-6}$ Pa and equal to or lower than $10^{-3}$ Pa, the heating temperature is set within a range equal to or higher than 580° C. and equal to or lower than 670° C., and the heating time is set within a range equal to or longer than 30 minutes and equal to or shorter than 240 minutes. In order to reliably inhibit the melting of the Cu—P—Sn-based brazing material 124, it is preferable that the heating temperature in the first heat treatment step S102 is 10° C. lower than the melting start temperature (solidus temperature) of the Cu—P—Sn-based brazing material 124.

In a case where the heating temperature is equal to or higher than 580° C. and the heating time is equal to or longer than 30 minutes in the first heat treatment step S102, the first intermetallic compound layer 16 can be sufficiently formed. Furthermore, in a case where the heating temperature is equal to or lower than 670° C., and the heating time is equal to or shorter than 240 minutes, it is possible to inhibit the formed first intermetallic compound layer 16 from becoming unnecessarily thick.

The lower limit of the heating temperature is preferably equal to or higher than 610° C., and more preferably equal to or higher than 620° C. The upper limit of the heating temperature is preferably equal to or lower than 650° C., and more preferably equal to or lower than 640° C. Furthermore, the lower limit of the heating time is preferably equal to or longer than 15 minutes, and more preferably equal to or longer than 60 minutes. The upper limit of the heating time is preferably equal to or shorter than 120 minutes, and more preferably equal to or shorter than 90 minutes.

Then, after the first heat treatment step S102, the Cu foil 122, the Ti material 25, the Cu—P—Sn-based brazing material 124, the ceramic substrate 11, the Cu—P—Sn-based brazing material 124, the Ti material 25, and the Cu foil 123 are heated at a temperature equal to or higher than the melting start temperature of the Cu—P—Sn-based brazing material 124 in a state where pressure (equal to or higher than 1 kgf/cm² and equal to or lower than 35 kgf/cm²) is applied thereto in the lamination direction (second heat treatment step S103). In the present embodiment, the internal pressure of the vacuum heating furnace is set within a range equal to or higher than $10^{-6}$ Pa and equal to or lower than $10^{-3}$ Pa, the heating temperature is set within a range equal to or higher than 600° C. and equal to or lower than 700° C., and the heating time is set within a range equal to or longer than 15 minutes and equal to or shorter than 120 minutes. In the second heat treatment step S103, in order to reliably melt the Cu—P—Sn-based brazing material 124, it is preferable that heating is performed at a temperature equal to or higher than the solidus temperature of the Cu—P—Sn-based brazing material 124 +10° C.

In the second heat treatment step S103, the Cu—P—Sn-based brazing material 124 is melted and forms a liquid phase. The Ti material 25 is melted into the liquid phase, and the liquid phase is solidified. As a result, the ceramic substrate 11 is bonded to the Cu foil 122 and the Cu foil 123. At this time, P and Ni contained in the Cu—P—Sn-based brazing material 124 are bonded to Ti of the Ti material 25. As a result, the second intermetallic compound layer 17 is formed, and the Cu—Sn layer 14 is formed on the ceramic substrate 11 side.

In the present embodiment, a portion of the Ti material 25 remains without being melted into the liquid phase of the Cu—P—Sn-based brazing material 124. As a result, the Ti layer 15 is formed between the first intermetallic compound layer 16 and the second intermetallic compound layer 17.

Accordingly, the circuit layer 112 is formed on one surface of the ceramic substrate 11, and the metal layer 113 is formed on the other surface of the ceramic substrate 11. In this way, the substrate 110 for a power module as the present embodiment is manufactured.

Then, the heat sink 130 is bonded to the lower surface of the metal layer 113 of the substrate 110 for a power module through a solder material (heat sink bonding step S104).

Thereafter, the semiconductor element 3 is bonded to the upper surface of the circuit layer 112 of the substrate 110 for a power module through a solder material (semiconductor element-bonding step S105).

In this way, the power module 101 according to the present embodiment is manufactured.

In the substrate 110 for a power module according to the present embodiment constituted as above, in the bonded interface between the ceramic substrate 11 and the circuit layer 112 and in the bonded interface between the ceramic substrate 11 and the metal layer 113, the first intermetallic compound layer 16 which is positioned on the circuit layer 112 side and the metal layer 113 side and contains Cu and Ti is formed. Accordingly, through the first intermetallic compound layer 16, the second intermetallic compound layers 17 can be reliably bonded to the circuit layer 112 and the metal layer 113. Therefore, even though the substrate 110 for a power module is used in a high-temperature environment, the brazing bonding strength between the circuit layer 112 and the ceramic substrate 11 and between the metal layer 113 and the ceramic substrate 11 can be secured.

In the bonded interface between the ceramic substrate 11 and the circuit layer 112 and the bonded interface between the ceramic substrate 11 and the metal layer 113, the Ti layer 15 is formed, but the thickness of the Ti layer 15 is equal to or smaller than 0.5 μm. Accordingly, the thermal resistance in the lamination direction of the circuit layer 112, the ceramic substrate 11, and the metal layer 113 can be kept low, and the heat generated from the semiconductor element 3 mounted on the circuit layer 112 can be efficiently radiated.

In the present embodiment, the thickness of the first intermetallic compound layer 16 is equal to or greater than 0.2 μm. Accordingly, the brazing bonding strength between the circuit layer 112 and the ceramic substrate 11 and between the metal layer 113 and the ceramic substrate 11 can be reliably improved. Meanwhile, because the thickness of the first intermetallic compound layer 16 is equal to or smaller than 6 μm, it is possible to inhibit the occurrence of breaking in the first intermetallic compound layer 16.

In the present embodiment, the thickness of the second intermetallic compound layer 17 is equal to or greater than 0.5 μm. Accordingly, the brazing bonding strength between the circuit layer 112 and the ceramic substrate 11 and between the metal layer 113 and the ceramic substrate 11 can be reliably improved. Meanwhile, because the thickness of the second intermetallic compound layer 17 is equal to or smaller than 4 μm, it is possible to inhibit the occurrence of breaking in the second intermetallic compound layer 17.

The method for manufacturing the power module substrate of the present embodiment includes a first heat treatment step S102 of putting the Cu foil 122, the Ti material 25, the Cu—P—Sn-based brazing material 124, the ceramic substrate 11, the Cu—P—Sn-based brazing material 124, the Ti material 25, and the Cu foil 123 into a vacuum heating furnace in a state where pressure (equal to or higher than 1 kgf/cm$^2$ and equal to or lower than 35 kgf/cm$^2$) is applied thereto in the lamination direction and performing heating at a temperature lower than the melting start temperature of the Cu—P—Sn-based brazing material 124. Accordingly, the first intermetallic compound layer 16 containing Cu and Ti can be reliably formed between the Cu foil 122 which will become the circuit layer 112 and the Ti material 25 and between the Cu foil 123 which will become the metal layer 113 and the Ti material 25.

Furthermore, the method for manufacturing the power module substrate of the present embodiment includes the second heat treatment step S103 of performing heating after the first heat treatment step S102 at a temperature equal to or higher than the melting start temperature of the Cu—P—Sn-based brazing material 124 so as to form the Cu—Sn layer 14 in which Sn forms a solid solution in Cu and the second intermetallic compound layer 17 which is positioned between the first intermetallic compound layer 16 and the Cu—Sn layer 14 and contains P and Ti. Accordingly, by causing Ti of the Ti material 25 to react with the Cu—P—Sn-based brazing material 124, the second intermetallic compound layer 17 can be formed, and the ceramic substrate 11 can be reliably bonded to the circuit layer 112 and the metal layer 113.

In a case where the pressure applied in the second heat treatment step S103 is equal to or higher than 1 kgf/cm$^2$, it is possible to bring the ceramic substrate 11 into close contact with the liquid phase of the Cu—P—Sn-based brazing material 124 and to excellently bond the ceramic substrate 11 and the Cu—Sn layer 14 to each other. Furthermore, in a case where the applied pressure is equal to or lower than 35 kgf/cm$^2$, the occurrence of breaking in the ceramic substrate 11 can be inhibited. For these reasons, in the present embodiment, the applied pressure is set within a range equal to or higher than 1 kgf/cm$^2$ and equal to or lower than 35 kgf/cm$^2$.

The method for manufacturing the substrate 110 for a power module according to the present embodiment adopts a constitution in which the bonding of the circuit layer 112 to one surface of the ceramic substrate 11 and the bonding of the metal layer 113 to the other surface of the ceramic substrate 11 are simultaneously performed. Therefore, it is possible to simplify the manufacturing process and to reduce the manufacturing cost.

Third Embodiment

Next, a third embodiment of the present invention will be described. Note that the same constituents as those in the first embodiment will be described using the same reference signs and will not be specifically described.

Figure 11:
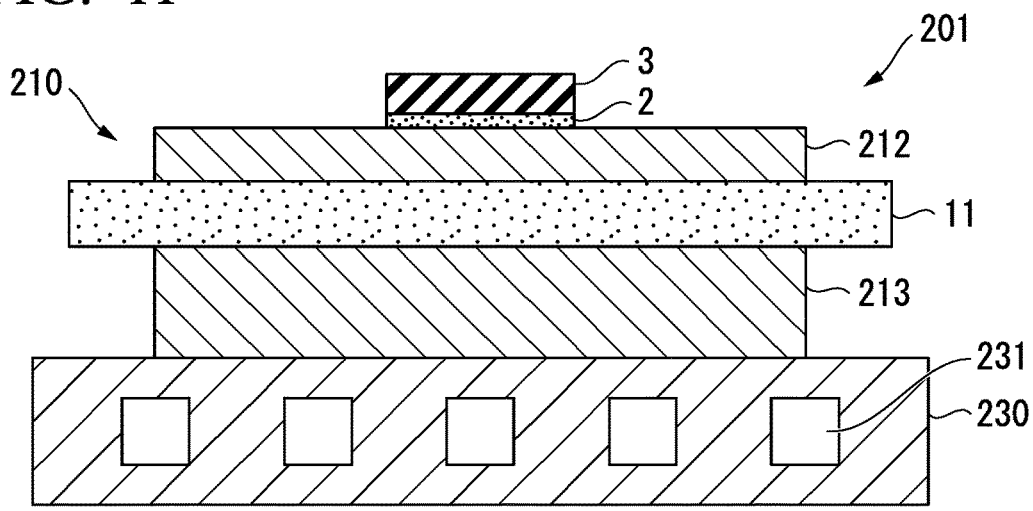
FIG. 11 is a view schematically describing a power module in which a power module substrate according to a third embodiment of the present invention is used.

FIG. 11 shows a power module 201 including a substrate 210 for a power module according to the third embodiment.

The power module 201 includes the substrate 210 for a power module provided with a circuit layer 212 and a metal layer 213, the semiconductor element 3 bonded to one surface (upper surface in FIG. 11) of the circuit layer 212 through the bonding layer 2, and a heat sink 230 bonded to the other side (lower side in FIG. 11) of the substrate 210 for a power module.

Figure 12:
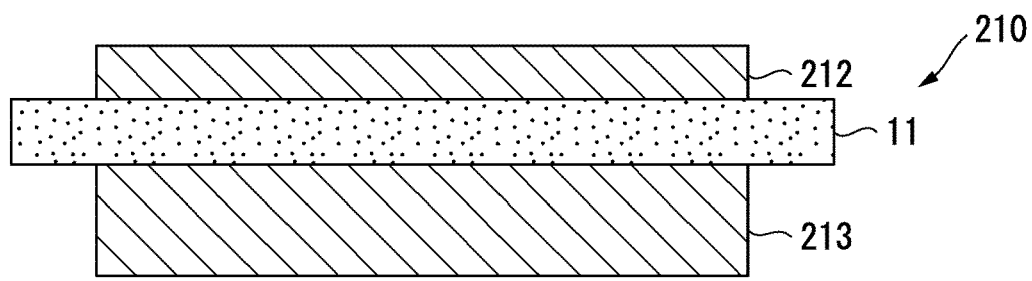
FIG. 12 is a view schematically describing the power module substrate according to a third embodiment of the present invention.

As shown in FIG. 12, the substrate 210 for a power module includes the ceramic substrate 11, the circuit layer 212 provided on one surface (upper surface in FIG. 12) of the ceramic substrate 11, and the metal layer 213 provided on the other surface (lower surface in FIG. 12) of the ceramic substrate 11.

The ceramic substrate 11 is constituted with aluminum nitride (AlN) having excellent heat radiation properties as in the first embodiment.

Figure 15:
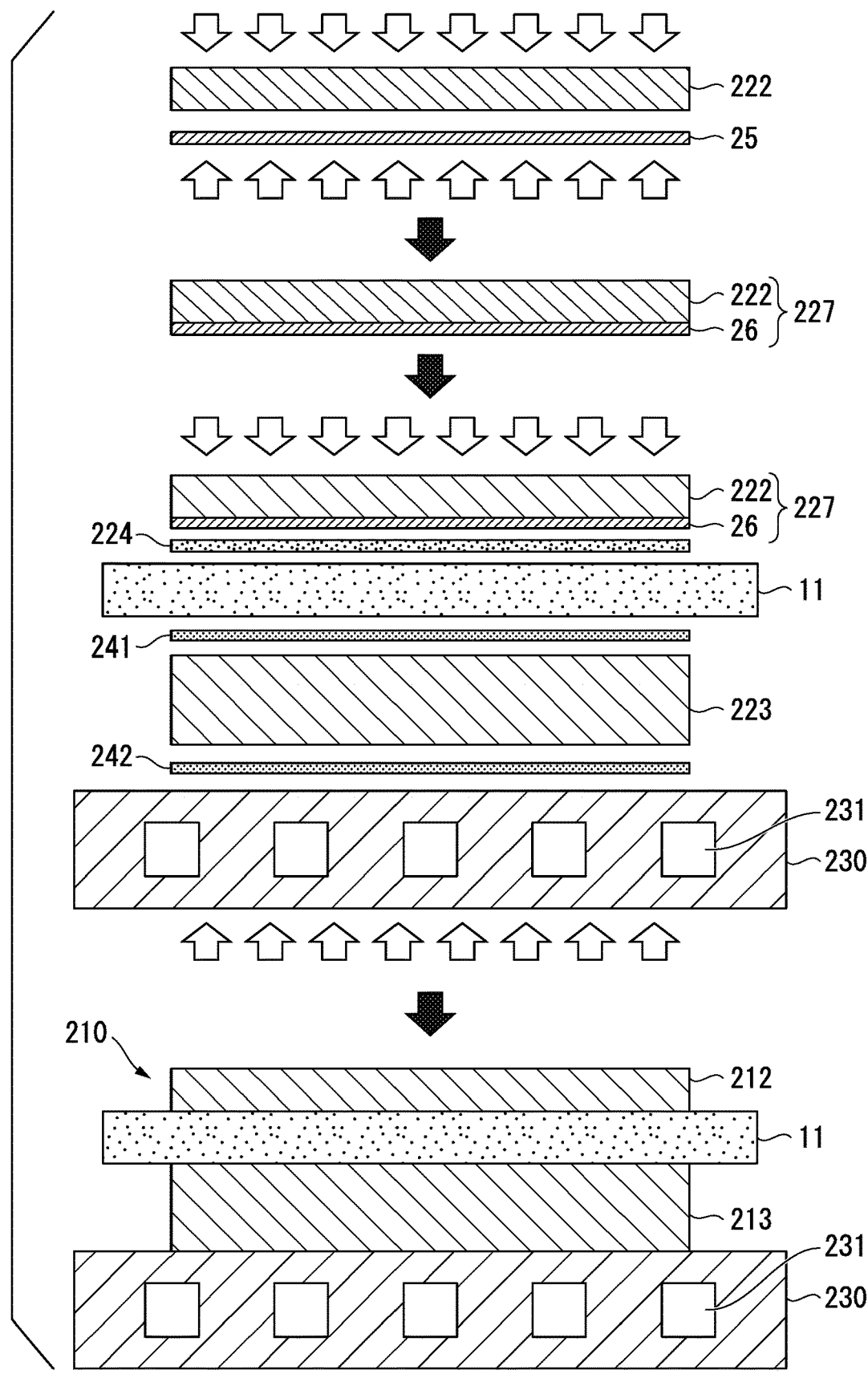
FIG. 15 is a view schematically describing the method for manufacturing the power module substrate and the method for manufacturing a power module according to the third embodiment of the present invention.

As in the first embodiment, the circuit layer 212 is formed by laminating a Cu—P—Sn-based brazing material 224, the Ti material 25, and a Cu foil 222 formed of oxygen-free copper on one surface of the ceramic substrate 11 and performing a heat treatment such that the Cu foil 222 is bonded to the ceramic substrate 11 (see FIG. 15).

The thickness of the circuit layer 212 is set within a range equal to or greater than 0.1 mm and equal to or smaller than 1.0 mm. In the present embodiment, the thickness of the circuit layer 212 is set to be 0.3 mm.

In the present embodiment, as the Cu—P—Sn-based brazing material 224, specifically, a Cu—P—Sn—Ni brazing material is used.

Figure 13:
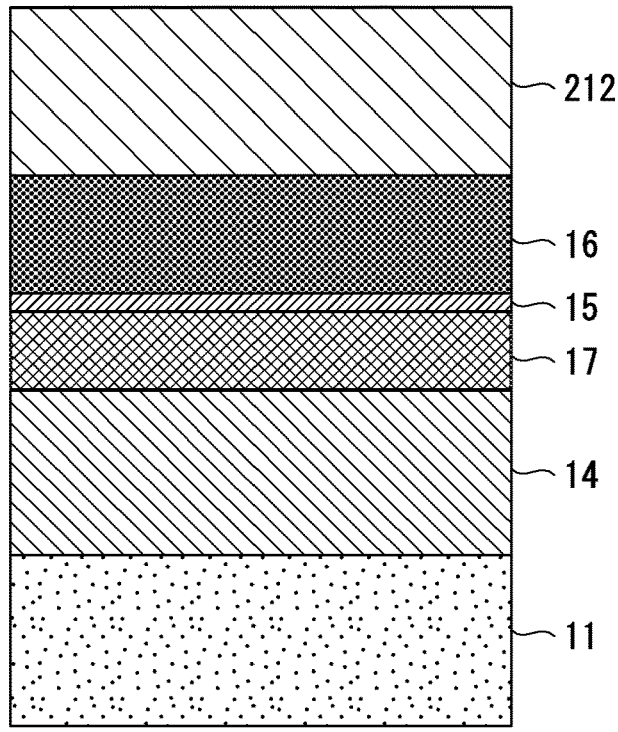
FIG. 13 is a cross-sectional view schematically describing a bonded interface between a circuit layer and a ceramic substrate in the power module substrate shown in FIG. 12.

As shown in FIG. 13, in a bonded interface between the ceramic substrate 11 and the circuit layer 212, the Cu—Sn layer 14 which is positioned on the ceramic substrate 11 side, the first intermetallic compound layer 16 which is positioned on the circuit layer 212 side and contains Cu and Ti, and the second intermetallic compound layer 17 which is positioned between the first intermetallic compound layer 16 and the Cu—Sn layer 14 and contains P and Ti are formed.

Furthermore, between the first intermetallic compound layer 16 and the second intermetallic compound layer 17, the Ti layer 15 is formed. The thickness of the Ti layer 15 is equal to or smaller than 0.5 µm.

By bonding an Al sheet formed of Al or an Al alloy to the other surface of the ceramic substrate 11, the metal layer 213 is formed. In the present embodiment, the metal layer 213 is formed by bonding an Al sheet 223 having a purity equal to or higher than 99.99 mass % to the other surface of the ceramic substrate 11 (see FIG. 15).

The thickness of the metal layer 213 is set within a range equal to or greater than 0.1 mm and equal to or smaller than 3.0 mm. In the present embodiment, the thickness of the metal layer 213 is set to be 1.6 mm.

The heat sink 230 is constituted with Al or an Al alloy. In the present embodiment, the heat sink 230 is constituted with A6063 (Al alloy). The heat sink 230 is provided with passages 231 for a cooling fluid to flow through the passages. The heat sink 230 and the metal layer 213 are bonded to each other by an Al—Si-based brazing material.

Figure 14:
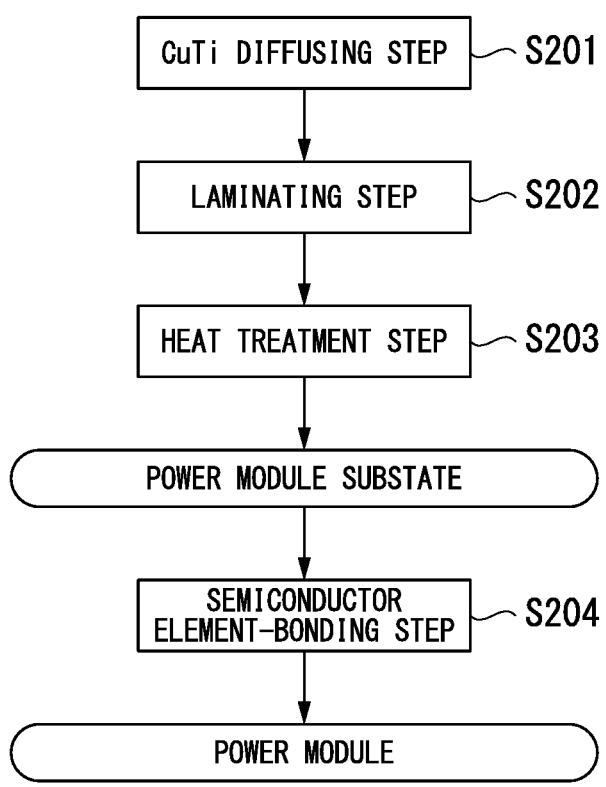
FIG. 14 is a flowchart describing a method for manufacturing the power module substrate and a method for manufacturing a power module according to the third embodiment of the present invention.

Next, a method for manufacturing the power module 201 according to the present embodiment will be described with reference to the flowchart in FIG. 14 and FIG. 15.

First, as shown in FIG. 15, the Cu foil 222 which will become the circuit layer 212 and the Ti material 25 are laminated, disposed in a vacuum heating furnace in a state where pressure (1 to 35 kgf/cm$^2$) is applied thereto in the lamination direction, and heated such that the Cu foil 222 and the Ti material 25 are bonded to each other by diffusion in solids, thereby obtaining a Cu—Ti bonded body 227 (CuTi diffusing step S201).

The thickness of the Ti material 25 is within a range equal to or greater than 0.4 µm and equal to or smaller than 5 µm. In a case where the thickness of the Ti material 25 is equal to or greater than 0.4 µm and less than 1 µm, it is preferable to deposit the Ti material 25 by vapor deposition or sputtering. In a case where the thickness of the Ti material 25 is equal to or greater than 1 µm and equal to or smaller than 5 µm, it is preferable to use a foil material. The lower limit of the thickness of the Ti material 25 is preferably equal to or greater than 0.4 µm, and more preferably equal to or greater than 0.5 µm. Furthermore, the upper limit of the thickness of the Ti material 25 is preferably equal to or smaller than 1.5 µm, and more preferably equal to or smaller than 0.7 µm. In the present embodiment, as the Ti material 25, a Ti foil having a thickness of 1.4 µm and a purity of 99.8 mass % is used.

In the CuTi diffusing step S201, the internal pressure of the vacuum heating furnace is set within a range equal to or higher than $10^{-6}$ Pa and equal to or lower than $10^{-3}$ Pa, the heating temperature is set within a range equal to or higher than 600° C. and equal to or lower than 670° C., and the heating time is set within a range equal to or longer than 30 minutes and equal to or shorter than 360 minutes. In a case where the heating temperature and the heating time in the CuTi diffusing step S201 are equal to or higher than 600° C. and equal to or longer than 30 minutes respectively, the first intermediate intermetallic compound layer can be sufficiently formed. Furthermore, in a case where the heating temperature is equal to or lower than 655° C. and the heating time is equal to or shorter than 360 minutes, it is possible to inhibit the formed first intermediate intermetallic compound layer from becoming unnecessarily thick.

The lower limit of the heating temperature is preferably equal to or higher than 610° C., and more preferably equal to or higher than 620° C. The upper limit of the heating temperature is preferably equal to or lower than 650° C., and more preferably equal to or lower than 640° C. Furthermore, the lower limit of the heating time is preferably equal to or longer than 15 minutes, and more preferably equal to or longer than 60 minutes. The upper limit of the heating time is preferably equal to or shorter than 120 minutes, and more preferably equal to or shorter than 90 minutes.

In order to more strongly bond the Cu foil 222 and the Ti material 25 to each other, it is preferable that the load applied in the lamination direction in the CuTi diffusing step S201 is within a range equal to or higher than 0.294 MPa and equal to or lower than 1.96 MPa (equal to or higher than 3 kgf/cm$^2$ and equal to or lower than 20 kgf/cm$^2$). The applied load is more preferably within a range equal to or higher than 0.490 MPa and equal to or lower than 1.47 MPa, and even more preferably within a range equal to or higher than 1.18 MPa and equal to or lower than 1.47 MPa.

In the Cu—Ti bonded body 227 obtained by the CuTi diffusing step S201, the Ti material 25 and the Cu foil 222 are bonded to each other by diffusion in solids, and a laminated structure of the Cu foil 222 and the intermediate Ti layer 26 is established. Between the intermediate Ti layer 26 and the Cu foil 222, the first intermediate intermetallic compound layer containing Cu and Ti is formed. At this time, not all the Ti material 25 is consumed for forming the first intermediate intermetallic compound layer, and a portion of the Ti material 25 remains.

In the present embodiment, the thickness of the intermediate Ti layer 26 is within a range equal to or greater than 0.1 µm and equal to or smaller than 3 µm. The lower limit of the thickness of the intermediate Ti layer 26 is preferably equal to or greater than 0.2 µm, and more preferably equal to or greater than 0.4 µm. The upper limit of the thickness of the intermediate Ti layer 26 is preferably equal to or smaller than 1.5 µm, and more preferably equal to or smaller than 0.7 µm.

Furthermore, the thickness of the first intermediate intermetallic compound layer is preferably equal to or greater than 0.1 µm and equal to or smaller than 6 µm.

Then, as shown in FIG. 15, the Cu—P—Sn-based brazing material 224, the Ti material 25, and the Cu foil 222 are laminated in this order on one surface (upper surface in FIG. 15) of the ceramic substrate 11, and the metal layer 213 and an Al sheet 223 are laminated in this order on the other surface (lower surface in FIG. 14) of the ceramic substrate 11 through a bonding material 241. Thereafter, the heat sink 230 is laminated on the lower side of the Al sheet 223 through a bonding material 242 (laminating step S202). Herein, the Cu—Ti bonded body 227 is laminated such that the intermediate Ti layer 26 and the Cu—P—Sn-based brazing material 224 face each other.

In the present embodiment, the composition of Cu—P—Sn-based brazing material 224 is Cu—7 mass % P—15 mass % Sn—10 mass % Ni. The melting start temperature (solidus temperature) of the Cu—P—Sn-based brazing material 224 is 580° C. As the Cu—P—Sn-based brazing material 224, a foil material is used, and the thickness thereof is within a range equal to or greater than 5 μm and equal to or smaller than 150 μm.

In the present embodiment, an Al—Si-based brazing material containing Si which is a melting point-lowering element is used as the bonding materials 241 and 242. In the third embodiment, Al—7.5 mass % Si brazing material is used.

Thereafter, the ceramic substrate 11, the Cu—P—Sn-based brazing material 224, the Cu—Ti bonded body 227, the bonding material 241, the Al sheet 223, the bonding material 242, and the heat sink 230 are put into a vacuum heating furnace in a state where pressure (1 to 35 kgf/cm$^2$) is applied thereto in the lamination direction, and heated (heat treatment step S203). In the present embodiment, the internal pressure of the vacuum heating furnace is set within a range equal to or higher than $10^{-6}$ Pa and equal to or lower than $10^{-3}$ Pa, the heating temperature is set within a range equal to or higher than 600° C. and equal to or lower than 650° C., and the heating time is set within a range equal to or longer than 30 minutes and equal to or shorter than 240 minutes.

In the heat treatment step S203, the Cu—P—Sn-based brazing material 224 is melted and forms a liquid phase. The intermediate Ti layer 26 is melted into the liquid phase, and the liquid phase is solidified. As a result, the ceramic substrate 11 and the Cu foil 222 are bonded to each other. At this time, P and Ni contained in the Cu—P—Sn-based brazing material 224 are bonded to Ti of the intermediate Ti layer 26. As a result, the second intermetallic compound layer 17 is formed, and the Cu—Sn layer 14 is formed on the ceramic substrate 11 side. The first intermetallic compound layer 16 is formed by the remaining first intermediate intermetallic compound layer.

In the present embodiment, the thickness of the intermediate Ti layer 26 is within a range equal to or greater than 0.1 μm and equal to or smaller than 3 μm. Accordingly, not all the intermediate Ti layer 26 is melted into the liquid phase of the Cu—P—Sn-based brazing material 224, and a portion of the intermediate Ti layer 26 remains and forms the Ti layer 15. However, because the formed Ti layer 15 is a thin layer having a thickness equal to or smaller than 0.5 μm, the thermal resistance in the lamination direction of the circuit layer 212, the ceramic substrate 11, and the metal layer 213 can be kept low, and the heat generated from the semiconductor element 3 mounted on the circuit layer 212 can be efficiently radiated.

Note that because sometimes the diffusion of Ti proceeds due to the heating in the heat treatment step S203, the thickness of the first intermetallic compound layer 16 becomes larger than the thickness of the first intermediate intermetallic compound layer. In addition, because sometimes the diffusion of Ti proceeds due to the heating in the heat treatment step S203, the thickness of the Ti layer 15 becomes smaller than the thickness of the intermediate Ti layer 26.

In the heat treatment step S203, the bonding material 241 is melted and forms a liquid phase, and the liquid phase is solidified. As a result, the ceramic substrate 11 and the Al sheet 223 are bonded to each other through the bonding material 241. Furthermore, in the heat treatment step S203, the bonding material 242 is melted and forms a liquid phase, and the liquid phase is solidified. As a result, the Al sheet 223 and the heat sink 230 are bonded to each other through the bonding material 242.

In this way, the substrate 210 for a power module as the present embodiment is manufactured.

Then, the semiconductor element 3 is bonded to the upper surface of the circuit layer 212 of the substrate 210 for a power module through a solder material (semiconductor element-bonding step S204).

In this way, the power module 201 as the present embodiment is manufactured.

The substrate 210 for a power module according to the present embodiment constituted as above exerts the same effects as those exerted by the substrates 10 and 110 for a power module described in the first present embodiment and the second present embodiment.

Furthermore, in the substrate 210 for a power module according to the present embodiment, by the bonding of the Al sheet 223 to the other surface of the ceramic substrate 11, the metal layer 213 is formed. Accordingly, the heat from the semiconductor element 3 can be efficiently dissipated through the metal layer 213. In addition, because Al has a relatively low deformation resistance, in a case where a thermal cycle is loaded, the metal layer 213 can absorb a thermal stress caused between the substrate 210 for a power module and the heat sink 230, and the occurrence of breaking in the ceramic substrate 11 can be inhibited.

The method for manufacturing the substrate 210 for a power module according to the present embodiment adopts a constitution in which the bonding of the circuit layer 212 to one surface of the ceramic substrate 11 and the bonding of the metal layer 213 to the other surface of the ceramic substrate 11 are simultaneously performed. Therefore, it is possible to simplify the manufacturing process and to reduce the manufacturing cost.

Hitherto, the embodiments of the present invention have been described. However, the present invention is not limited thereto and can be appropriately modified within a scope that does not depart from the technical idea of the present invention.

For example, in the present embodiment, a case was described where a semiconductor element is mounted on the insulated circuit board so as to constitute a power module. However, the present invention is not limited thereto. For instance, an LED element may be mounted on the circuit layer of the insulated circuit board so as to constitute an LED module, or a thermoelectric element may be mounted on the circuit layer of the insulated circuit board so as to constitute a thermoelectric module.

In the second embodiment and the third embodiment, a case was described where the bonding of the circuit layer to one surface of the ceramic substrate and the bonding of the metal layer to the other surface of the ceramic substrate are simultaneously performed. However, the circuit layer and the metal layer may be separately bonded.

In addition, in the third embodiment, a case was described where the circuit layer, the metal layer, and the heat sink are simultaneously bonded. However, a constitution may be adopted in which the circuit layer and the metal layer are bonded to the ceramic substrate, and then the metal layer and the heat sink are bonded to each other.

Furthermore, in the third embodiment, a case was described where the metal layer is bonded to the other surface of the ceramic substrate through the Al—Si-based brazing material. However, the metal layer may be bonded using a transient liquid phase (TLP) bonding method, Ag paste, or the like.

In the second embodiment and the third embodiment, a case was described where a heat sink provided with passages is used. However, a plate-like member called a radiating plate or a member having a pin-like fin may be used.

Furthermore, a case was described above where the power module substrate and the heat sink are bonded to each other by using a solder material or a brazing material. However, a constitution may be adopted in which the power module substrate and the heat sink are fastened to each other by a screw and the like through grease provided therebetween.

In addition, in the power module substrate in the second embodiment and the third embodiment, a heat sink may not be bonded to the other surface side of the power module substrate.

In the first embodiment, the second embodiment, and the third embodiment, a case where a Ti foil is used as a Ti material or a case where a Ti material is formed by vapor deposition or sputtering was described. However, a Cu member/Ti clad material in which Ti is provided on one surface of a Cu member can also be used. In this case, the Cu member/Ti clad material may be preheated such that a first intermetallic compound layer containing Cu and Ti is formed, or the first intermetallic compound layer may be formed in the interior of the Cu member/Ti clad material in the first heat treatment step.

Furthermore, it is also possible to use a Ti material/brazing material clad material in which a Cu—P—Sn-based brazing material is provided on one surface of a Ti material or a Cu member/Ti material/brazing material clad in which a Cu member, a Ti material, and a Cu—P—Sn-based brazing material are laminated in this order.

In the above embodiments, a case where a foil material of a Cu—P—Sn-based brazing material is used was described for example. However, the present invention is not limited thereto, and powder or paste can also be used.

Furthermore, in the above embodiments, a case where a Cu—P—Sn—Ni brazing material or a Cu—P—Sn brazing material is used as the Cu—P—Sn-based brazing material was described. However, other Cu—P—Sn-based brazing materials may also be used. Hereinafter, the Cu—P—Sn-based brazing material used in the method for manufacturing the bonded body of the present invention will be specifically described.

The content of P in the Cu—P—Sn-based brazing material is preferably equal to or greater than 3 mass % and equal to or smaller than 10 mass %.

P is an element having an operation and effect of reducing the melting start temperature of the brazing material. In a case where P is oxidized, P oxide occurs. P is an element having an operation and effect of coating the surface of the brazing material with the P oxide so as to prevent the oxidation of the brazing material, and coating the surface of the molten brazing material with the P oxide having excellent fluidity so as to improve the wettability of the brazing material.

In a case where the content of P is less than 3 mass %, the effect of reducing the melting start temperature of the brazing material may not be sufficiently obtained. Accordingly, the melting start temperature of the brazing material may be increased or the fluidity of the brazing material may become insufficient. As a result, the bonding properties between the ceramic substrate and the circuit layer may be reduced. Furthermore, in a case where the content of P is greater than 10 mass %, a large amount of brittle intermetallic compound may be formed. As a result, the bonding properties and the bonding reliability between the ceramic substrate and the circuit layer may be reduced.

For these reasons, the content of P in the Cu—P—Sn-based brazing material is preferably within a range equal to or greater than 3 mass % and equal to or smaller than 10 mass %.

The content of Sn in the Cu—P—Sn-based brazing material is preferably equal to or greater than 0.5 mass % and equal to or smaller than 25 mass %.

Sn is an element having an operation and effect of reducing the melting start temperature of the brazing material. In a case where the content of Sn is equal to or greater than 0.5 mass %, the melting start temperature of the brazing material can be reliably reduced. In a case where the content of Sn is equal to or smaller than 25 mass %, it is possible to inhibit the brazing material from becoming brittle at a low temperature and to improve the bonding reliability between the ceramic substrate and the circuit layer.

For these reasons, the content of Sn in the Cu—P—Sn-based brazing material is preferably within a range equal to or greater than 0.5 mass % and equal to or smaller than 25 mass %.

The Cu—P—Sn-based brazing material may contain one kind of element or two or more kinds of elements among Ni, Cr, Fe, and Mn in an amount equal to or greater than 2 mass % and equal to or smaller than 20 mass %.

Ni, Cr, Fe, and Mn are elements having an operation and effect of inhibiting the formation of an intermetallic compound containing P in the interface between the ceramic substrate and the brazing material.

In a case where the content of one kind of element or two or more kinds of elements among Ni, Cr, Fe, and Mn is equal to or greater than 2 mass %, the formation of an intermetallic compound containing P in the bonded interface between the ceramic substrate and the brazing material can be inhibited, and the bonding reliability between the ceramic substrate and the circuit layer can be improved. Furthermore, in a case where the content of one kind of element or two or more kinds of elements among Ni, Cr, Fe, and Mn is equal to or smaller than 20 mass %, it is possible to inhibit the increase of the melting start temperature of the brazing material, to inhibit the decrease of the fluidity of the brazing material, and to improve the bonding properties between the ceramic substrate and the circuit layer.

For these reasons, in a case where the Cu—P—Sn-based brazing material contains one kind of element or two or more kinds of elements among Ni, Cr, Fe, and Mn, the content of the element is preferably within a range equal to or greater than 2 mass % and equal to or smaller than 20 mass %.

EXAMPLES

Example 1

Hereinafter, the results of experiments performed to check the effects of the present invention will be described.

Examples 1 to 3, 12, 14, and 15 of the Present Invention (Heating Method: A)

A Cu—P—Sn-based brazing material foil and a Ti material shown in Table 1 and a Cu foil formed of oxygen-free copper (thickness: 0.3 mm) were laminated in this order on one surface and the other surface of a ceramic substrate (40 mm×40 mm, thickness of 0.635 mm for AlN and $Al_2O_3$ substrates, thickness of 0.32 mm for $Si_3N_4$ substrate) described in Table 1. Then, a load of 15 kgf/cm² was applied thereto in the lamination direction.

The aforementioned laminate was put into a vacuum heating furnace (pressure: $10^{-4}$ Pa), and as a first heat treatment step, the laminate was heated at a temperature for a time described in Table 1 (column of Heat treatment 1). Then, as the second heat treatment step, the laminate was heated at a temperature for a time described in Table 2 (column of Heat treatment 2) so as to bond the Cu foil to one surface and the other surface of the ceramic substrate and to form a circuit layer and a metal layer, thereby obtaining a power module substrate.

The Cu foil for the circuit layer that was prepared for a 90° peel strength test, which will be described later, had a size of 44 mm×25 mm (here, the Cu foil protruded 5 mm from the end of the ceramic substrate), and the Cu foil for the circuit layer that was prepared for a thermal resistance test had a size of 37 mm×37 mm. The Cu foil for the metal layer had a size of 37 mm×37 mm.

Examples 4 to 11 and 13 of the Present Invention (Heating Method: B)

First, as the CuTi diffusing step, a Cu foil (thickness: 0.3 mm) formed of oxygen-free copper and a Ti material described in Table 1 were laminated. The laminate was put into a vacuum heating furnace (pressure: $10^{-4}$ Pa) in a state where a pressure of 15 kgf/cm² was applied thereto in the lamination direction, and heated at a temperature for a time described in Table 1 (column of Heat treatment 1), thereby obtaining a Cu—Ti bonded body. The Cu—Ti bonded body was prepared for a circuit layer and a metal layer respectively.

Then, a Cu—P—Sn-based brazing material foil shown in Table 1 and the Cu—Ti bonded body were laminated in this order on one surface and the other surface of a ceramic substrate (40 mm×40 mm, thickness of 0.635 mm for AlN and $Al_2O_3$ substrates, thickness of 0.32 mm for $Si_3N_4$ substrate) described in Table 1.

Thereafter, the laminate was heated at a temperature for a time described in Table 2 (column of Heat treatment 2) so as to bond the Cu foil to one surface and the other surface of the ceramic substrate and to form a circuit layer and a metal layer, thereby preparing a power module substrate. The size of each of the Cu foils for a circuit layer and a metal layer was the same as that described above.

Examples 1 and 2 of the Related Art

A Cu—P—Sn-based brazing material foil and a Ti material shown in Table 1 and a Cu foil (thickness: 0.3 mm) formed of oxygen-free copper were laminated in this order on one surface and the other surface of a ceramic substrate (40 mm×40 mm×0.635 mmt) described in Table 1, and a load of 15 kgf/cm² was applied thereto in the lamination direction.

Then, the aforementioned laminate was put into a vacuum heating furnace (pressure: $10^{-4}$ Pa), and as the second heat treatment step, the laminate was heated at a temperature for a time described in Table 2 (column of Heat treatment 2) so as to bond the Cu foil to one surface and the other surface of the ceramic substrate and to form a circuit layer and a metal layer, thereby obtaining a power module substrate.

The size of each of the Cu foils for a circuit layer and a metal layer was the same as that in the examples of the present invention.

The power module substrate obtained as above was evaluated in terms of 90° peel strength between the circuit layer and the ceramic substrate and thermal resistance in the lamination direction.

Furthermore, the obtained power module substrate was evaluated in terms of the thickness of each of the first intermetallic compound layer, the Ti layer, and the second intermetallic compound layer in the bonded interface between the ceramic substrate and the circuit layer. In addition, the thickness of each of the first intermediate intermetallic compound layer and the intermediate Ti layer obtained after the heat treatment 1 was evaluated.

(90° Peel Strength Test)

Each of the power module substrates was left to stand for 500 hours at 150° C. Then, a portion of the circuit layer protruding from the ceramic substrate was folded at 90°, the circuit layer was pulled in a direction perpendicular to the ceramic substrate, and a maximum tensile load at which the circuit layer was peeled from the ceramic substrate was measured. A value obtained by dividing the load by a bonding length was adopted as 90° peel strength and described in Table 2. In the present example, the length (39 mm) of a side of the circuit layer in a portion where the circuit layer and the ceramic substrate were bonded to each other was adopted as the bonding length.

(Thermal Resistance Test)

A heater chip (13 mm×10 mm×0.25 mm) was joined to the surface of the circuit layer by soldering, and the ceramic substrate was laminated on a cooler. Then, the heater chip was heated at 100 W power, and the temperature of the heater chip was measured using a thermocouple. Furthermore, the temperature of a cooling medium (ethylene compound:water=9:1) flowing through the cooler was measured. A temperature difference between the heater chip and the cooling medium was divided by the power, and the obtained value was adopted as a thermal resistance. By regarding the thermal resistance of Example 1 of the present invention as 1.00, relative evaluation was performed. The evaluation results are shown in Table 2.

(Thickness of Each of First Intermediate Intermetallic Compound Layer, Intermediate Ti Layer, First Intermetallic Compound Layer, Ti Layer, and Second Intermetallic Compound Layer)

In order to determine the thickness of each of the first intermetallic compound layer, the Ti layer, and the second intermetallic compound layer, by EPMA performed on the interface of Cu foil/ceramic substrate, the total area of the first intermetallic compound layer formed in the bonded interface, the area of the Ti layer, and the total area of the second intermetallic compound layer were measured in a visual field (length: 30 μm, width: 40 μm) of a 10,000× magnification, and each of the measured values was divided by the dimension of width of the visual field for measurement. The average of the values obtained as above from 5 visual fields was adopted as the thickness of each of the first intermetallic compound layer, the Ti layer, and the second intermetallic compound layer.

In order to determine the thickness of each of the first intermediate intermetallic compound layer and the intermediate Ti layer, by EPMA performed on the bonded interface between Cu and Ti of the Cu—Ti bonded body prepared by the heating method B described above, the total area of the first intermediate intermetallic compound layer formed in the bonded interface and the total area of the intermediate Ti layer were measured in a visual field (length: 30 μm, width: 40 μm) of 10,000× magnification, and each of the measured values was divided by the dimension of width of the visual field for measurement. The average of the values obtained as above from 5 visual fields was adopted as the thickness of each of the first intermediate intermetallic compound layer and the intermediate Ti layer.

Note that a region in which the Ti concentration is within a range of 15 at % to 70 at % is regarded as the first intermetallic compound layer and the first intermediate intermetallic compound layer and regarded as not containing a solid solution.

Furthermore, a region which contains at least P and Ti and in which the P concentration is within a range of 28 at % to 52 at % is regarded as the second intermetallic compound layer.

The evaluation results are shown in Table 1 and Table 2.

TABLE 1

| | Ceramic substrate | Cu—P—Sn-based brazing material | | | | Thickness Melting point [° C.] | Thickness of Ti material [μm] | Heating method | Heat treatment 1 | | Thickness of each layer [μm] | |
| | | Component [mass %] | | | | | | | Temperature [° C.] | Time [min] | First intermediate intermetallic compound layer | Intermediate Ti layer |
| | | P | Sn | Other elements | Cu | | | | | | | |
|---|---|---|---|---|---|---|---|---|---|---|---|---|
| Example 1 of the present invention | AlN | 6.3 | 9.3 | Ni | 7.0 Balance | 600 | 2 | A | 590 | 30 | — | — |
| Example 2 of the present invention | AlN | 6.3 | 9.3 | Ni | 7.0 Balance | 600 | 5 | A | 590 | 240 | — | — |
| Example 3 of the present invention | AlN | 6.3 | 9.3 | Ni | 7.0 Balance | 600 | 1.5 | A | 600 | 45 | — | — |
| Example 4 of the present invention | AlN | 7.0 | 15.0 | Ni | 10.0 Balance | 580 | 1 | B | 600 | 90 | 0.9 | 0.4 |
| Example 5 of the present invention | AlN | 7.0 | 15.0 | Ni | 10.0 Balance | 580 | 3 | B | 670 | 30 | 0.8 | 2.7 |
| Example 6 of the present invention | AlN | 6.3 | 9.3 | Ni | 7.0 Balance | 600 | 0.7 | B | 630 | 60 | 0.6 | 0.5 |
| Example 7 of the present invention | Al$_2$O$_3$ | 6.3 | 9.3 | Ni | 7.0 Balance | 600 | 0.7 | B | 630 | 60 | 0.6 | 0.5 |
| Example 8 of the present invention | Si$_3$N$_4$ | 6.3 | 9.3 | Ni | 7.0 Balance | 600 | 0.7 | B | 630 | 60 | 0.6 | 0.4 |
| Example 9 of the present invention | AlN | 7.0 | 15.0 | Ni | 10.0 Balance | 580 | 0.7 | B | 620 | 30 | 0.4 | 0.4 |
| Example 10 of the present invention | AlN | 7.0 | 15.0 | Mn | 5.0 Balance | 580 | 0.6 | B | 640 | 90 | 0.8 | 0.2 |
| Example 11 of the present invention | AlN | 6.3 | 9.3 | Cr | 7.0 Balance | 600 | 0.4 | B | 620 | 60 | 0.5 | 0.3 |
| Example 12 of the present invention | AlN | 6.3 | 9.3 | Ni | 7.0 Balance | 600 | 3 | A | 580 | 30 | — | — |
| Example 13 of the present invention | AlN | 6.3 | 9.3 | Ni | 7.0 Balance | 600 | 5 | B | 670 | 180 | 7.0 | 2.1 |
| Example 14 of the present invention | AlN | 6.3 | 9.3 | Ni | 7.0 Balance | 600 | 1 | A | 650 | 120 | — | — |
| Example 15 of the present invention | AlN | 6.3 | 9.3 | Ni | 7.0 Balance | 600 | 5 | A | 580 | 45 | — | — |
| Conventional Example 1 | AlN | 6.3 | 9.3 | Ni | 7.0 Balance | 600 | 15 | — | — | — | — | — |
| Conventional Example 2 | AlN | 6.3 | 9.3 | Ni | 7.0 Balance | 600 | 3 | — | — | — | — | — |

TABLE 2

| | Heat treatment 2 | | Thickness of each layer [μm] | | | 90° peel strength [N/cm] | Ratio of thermal resistance |
| | Temperature [° C.] | Time [min] | First intermetallic compound layer | Ti layer | Second intermetallic compound layer | | |
|---|---|---|---|---|---|---|---|
| Example 1 of the present invention | 630 | 15 | 0.2 | 0.1 | 2.1 | 126 | 1.00 |
| Example 2 of the present invention | 610 | 15 | 5.9 | 0.1 | 3.5 | 124 | 1.01 |
| Example 3 of the present invention | 610 | 15 | 0.5 | 0.15 | 1.5 | 140 | 1.02 |
| Example 4 of the present invention | 630 | 150 | 1.1 | 0.0 | 0.5 | 135 | 1.00 |

TABLE 2-continued

| | Heat treatment 2 | | Thickness of each layer [μm] | | | 90° peel strength [N/cm] | Ratio of thermal resistance |
| --- | --- | --- | --- | --- | --- | --- | --- |
| | Temperature [° C.] | Time [min] | First intermetallic compound layer | Ti layer | Second intermetallic compound layer | | |
| Example 5 of the present invention | 600 | 240 | 1.0 | 0.0 | 3.8 | 134 | 1.00 |
| Example 6 of the present invention | 600 | 240 | 0.8 | 0.0 | 1.0 | 148 | 0.99 |
| Example 7 of the present invention | 600 | 240 | 0.7 | 0.0 | 1.0 | 147 | 1.01 |
| Example 8 of the present invention | 600 | 240 | 0.8 | 0.0 | 1.1 | 142 | 0.99 |
| Example 9 of the present invention | 650 | 150 | 0.6 | 0.0 | 0.9 | 166 | 0.99 |
| Example 10 of the present invention | 670 | 60 | 1.0 | 0.1 | 0.5 | 156 | 1.00 |
| Example 11 of the present invention | 670 | 120 | 0.6 | 0.0 | 0.6 | 148 | 0.98 |
| Example 12 of the present invention | 650 | 90 | 0.1 | 0.0 | 3.6 | 88 | 1.00 |
| Example 13 of the present invention | 670 | 120 | 7.2 | 0.0 | 3.0 | 105 | 1.02 |
| Example 14 of the present invention | 630 | 15 | 3.5 | 0.1 | 0.3 | 105 | 1.01 |
| Example 15 of the present invention | 630 | 15 | 0.3 | 0.1 | 5.1 | 107 | 1.01 |
| Conventional Example 1 | 650 | 150 | 6.3 | 3.7 | 5.1 | 158 | 1.06 |
| Conventional Example 2 | 650 | 150 | 0.0 | 0.0 | 3.9 | 79 | 0.99 |

In Example 1 of the related art in which a thick Ti layer was formed, it was confirmed that the 90° peel strength is high, but the thermal resistance in the lamination direction is high. Furthermore, in Example 2 of the related art in which no Ti layer was checked, it was confirmed that the first intermetallic compound layer is not formed, and the 90° peel strength is low.

In contrast, in Examples 1 to 15 of the present invention, it was confirmed that power module substrates having a high 90° peel strength and a low thermal resistance are obtained.

Example 2

Then, a more rigorous peel strength test was performed.

Frist, as the CuTi diffusing step, a Cu foil (thickness: 0.3 mm) formed of oxygen-free copper and a Ti material having a thickness of 3 mm were laminated, and the laminate was put into a vacuum heating furnace (pressure: 10$^{-4}$ Pa) in a state where pressure shown in Table 3 was applied thereto in the lamination direction. The laminate was heated at a temperature for a time described in Table 3 (column of Heat treatment 1), thereby obtaining a Cu—Ti bonded body. The Cu—Ti bonded body was prepared for a circuit layer and a metal layer respectively.

Thereafter, a Cu—6.3 mass % P—9.3 mass % Sn—7.0 mass % Ni brazing material foil (melting point 600° C.) and the Cu—Ti bonded body were laminated in this order on one surface and the other surface of the ceramic substrate (40 mm×40 mm, a thickness of 0.635 mm for AlN and Al$_2$O$_3$ substrates, a thickness of 0.32 mm for Si$_3$N$_4$ substrate) described in Table 3.

Subsequently, as the heat treatment 2, the laminate was heated under the conditions of 650° C. and 60 min so as to bond the Cu foil to one surface and the other surface of the ceramic substrate and to form a circuit layer and a metal layer, thereby preparing a power module substrate. The size of each of the Cu foils for the circuit layer and the metal layer was the same as that described above.

The power module substrate obtained as above was evaluated in terms of 90° peel strength between the circuit layer and the ceramic substrate under the following conditions.

Each of the power module substrates was left to stand for 1,000 hours at 150° C. Then, a portion of the circuit layer protruding from the ceramic substrate was folded at 90°, the circuit layer was pulled in a direction perpendicular to the ceramic substrate, and a maximum tensile load at which the circuit layer was peeled from the ceramic substrate was measured. A value obtained by dividing the load by a bonding length was adopted as 90° peel strength and described in Table 3. In the present example, the length of a side of the circuit layer in a portion where the circuit layer and the ceramic substrate were bonded to each other was adopted as the bonding length.

TABLE 3

| | Ceramic substrate | Heat treatment 1 | | | Heat treatment 2 | | 90° peel strength [N/cm] |
|---|---|---|---|---|---|---|---|
| | | Temperature [° C.] | Time [min] | Load MPa | Temperature [° C.] | Time [min] | |
| Example 21 of the present invention | AlN | 630 | 240 | 0.490 | 650 | 60 | 104 |
| Example 22 of the present invention | Al$_2$O$_3$ | 630 | 210 | 0.490 | | | 103 |
| Example 23 of the present invention | Si$_3$N$_4$ | 670 | 360 | 0.294 | | | 113 |
| Example 24 of the present invention | AlN | 670 | 360 | 1.96 | | | 124 |
| Example 25 of the present invention | AlN | 650 | 240 | 1.18 | | | 117 |
| Example 26 of the present invention | AlN | 650 | 270 | 1.18 | | | 119 |
| Example 27 of the present invention | Al$_2$O$_3$ | 650 | 300 | 1.18 | | | 120 |
| Example 28 of the present invention | Si$_3$N$_4$ | 650 | 300 | 1.47 | | | 124 |
| Example 29 of the present invention | AlN | 650 | 180 | 0.980 | | | 109 |
| Example 30 of the present invention | AlN | 650 | 150 | 0.980 | | | 116 |
| Example 31 of the present invention | AlN | 650 | 240 | 0.098 | | | 96 |

It was confirmed that even though the peel test is performed under the stringent conditions by applying high pressure in the lamination direction and setting the heating time to be long, a sufficient peel strength can be secured.

INDUSTRIAL APPLICABILITY

According to the bonded body, the power module substrate, the method for manufacturing the bonded body, and the method for manufacturing the power module substrate of the present invention, the ceramic member and the Cu member can be excellently bonded to each other, and the thermal resistance in the lamination direction can be reduced.

REFERENCE SIGNS LIST 10, 110, 210: Power module substrate (bonded body)
11: Ceramic substrate (ceramic member)
12, 112, 212: Circuit layer (Cu member)
14: Cu—Sn layer
15: Ti layer
16: First intermetallic compound layer
17: Second intermetallic compound layer
22, 122, 123, 222: Cu foil (Cu member)
24, 124, 224: Cu—P—Sn-based brazing material

The invention claimed is:

1. A bonded body comprising, in this order:
a Cu member formed of Cu or a Cu alloy;
a first intermetallic compound layer which contains Cu and Ti;
a Ti layer formed of Ti material;
a second intermetallic compound layer which contains P and Ti; and
a Cu—Sn layer in which Sn forms a solid solution in Cu; and
a ceramic member formed of ceramics;
wherein:
the Cu—Sn layer is positioned on the ceramic member,
the second intermetallic compound layer is positioned between the Ci-Sn layer and the Ti layer,
the Ti layer is positioned between the second intermetallic compound layer and the first intermetallic compound layer,
the first intermetallic compound layer is positioned between the Ti layer and the Cu member, and
the Cu member is positioned on the first intermetallic compound layer,
and wherein a thickness of the Ti layer is equal to or smaller than 0.5 µm.

2. The bonded body according to claim 1,
wherein a thickness of the first intermetallic compound layer is within a range equal to or greater than 0.2 µm and equal to or smaller than 6 µm.

3. The bonded body according to claim 1,
wherein a thickness of the second intermetallic compound layer is within a range equal to or greater than 0.5 µm and equal to or smaller than 4 µm.

4. A power module substrate which is the bonded body according to claim 1,
wherein the Cu member forms a circuit layer on one surface of the ceramic member; and
a 90° peel strength between the circuit layer and the ceramic member is 88 N/cm or more.

5. The power module substrate according to claim 4,
wherein a metal layer formed of Al or an Al alloy is formed on the other surface of the ceramic member.

6. A power module substrate which is the bonded body according to claim 1,
wherein the Cu member forms a metal layer on one surface of the ceramic member; and
further comprising a circuit layer formed on the other surface of the ceramic member.

7. The bonded body according to claim 1,
the Cu—Sn layer is formed with a Cu—P—Sn-based brazing material by performing heating at a temperature equal to or higher than a melting start temperature of the Cu—P—Sn-based brazing material.

* * * * *